(12) United States Patent
Grimbergen et al.

(10) Patent No.: US 6,406,924 B1
(45) Date of Patent: Jun. 18, 2002

(54) ENDPOINT DETECTION IN THE FABRICATION OF ELECTRONIC DEVICES

(75) Inventors: Michael N. Grimbergen, Redwood City; Thorsten B. Lill, Sunnyvale, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/286,493

(22) Filed: Apr. 5, 1999

Related U.S. Application Data

(63) Continuation-in-part of application No. 09/062,520, filed on Apr. 17, 1998.

(51) Int. Cl.[7] ............................................. H01L 21/00
(52) U.S. Cl. .................... 438/9; 156/345; 216/60; 356/357; 438/723; 438/743
(58) Field of Search ................ 438/9, 14, 16, 438/723, 743; 216/56, 60; 156/345 MT; 356/357

(56) References Cited

U.S. PATENT DOCUMENTS

| | | | |
|---|---|---|---|
| 3,612,692 A | 10/1971 | Kruppa et al. | 356/108 |
| 3,824,017 A | 7/1974 | Galyon | 356/108 |
| 3,874,797 A | 4/1975 | Kasai | 356/118 |
| 3,985,447 A | 10/1976 | Aspnes | 356/118 |
| 4,141,780 A | 2/1979 | Kleinknecht et al. | 356/118 |
| 4,147,435 A | 4/1979 | Habegger | 356/357 |
| 4,198,261 A | 4/1980 | Busta et al. | 156/626 |
| 4,208,240 A | 6/1980 | Latos | 156/627 |
| 4,317,698 A | 3/1982 | Christol et al. | 156/626 |
| 4,328,068 A | 5/1982 | Curtis | 156/626 |
| 4,367,044 A | 1/1983 | Booth, Jr. et al. | 356/357 |
| 4,454,001 A | 6/1984 | Sternheim et al. | 156/626 |
| 4,611,919 A | 9/1986 | Brooks, Jr. et al. | 356/357 |
| 4,618,262 A | 10/1986 | Maydan et al. | 356/357 |
| 4,838,694 A | 6/1989 | Betz et al. | 356/357 |
| 4,846,928 A | 7/1989 | Dolins et al. | 156/626 |
| 4,847,792 A | 7/1989 | Barna et al. | 364/552 |
| 4,861,419 A | 8/1989 | Flinchbaugh et al. | 156/626 |
| 4,927,485 A | 5/1990 | Cheng et al. | 156/345 |
| 4,953,982 A | 9/1990 | Ebbing et al. | 356/357 |
| 4,972,072 A | 11/1990 | Hauser et al. | 250/225 |

(List continued on next page.)

FOREIGN PATENT DOCUMENTS

| | | |
|---|---|---|
| EP | 0511448 | 4/1991 |
| EP | 709877 | 5/1996 |
| EP | 0753912 | 7/1996 |
| GB | 2293795 | 4/1996 |

OTHER PUBLICATIONS

Maynard, et al., "Multiwavelength Ellipsometry for Real-time Process Control of the Plasma Etching of Patterned Samples," *J. Vac. Sci. Technol. B*, 15(1), Jan./Feb. 1997, pp. 109–115.

Klemens, F.P., et al., High Density Plasma Gate Etching of 0.12 $\mu$m Devices with Sub 1.5 nm Gate–Oxides, *Electrochemical Society Proceedings*, vol. 97–30, pp. 85–95.

European Search Report dated Sep. 4, 4001., P.B. 5818–Patentlaan 2, 2280 HV Rijswijk (ZH), The Hague.

*Primary Examiner*—William A. Powell
(74) *Attorney, Agent, or Firm*—Janah & Associates

(57) ABSTRACT

A chamber 28 comprises a radiation source 58 capable of emitting radiation having a wavelength that is substantially absorbed in a predetermined pathlength in a thickness of a layer 22 on a substrate, and a radiation detector 62 adapted to detect the radiation. The radiation is substantially absorbed in a first thickness of the layer 22, and after at least partial processing of the layer 22, is at least partially transmitted through a second thickness of the layer 22 and reflected by one or more underlayers 24 of the substrate 20.

96 Claims, 11 Drawing Sheets

U.S. PATENT DOCUMENTS

| | | | |
|---|---|---|---|
| 5,131,752 A | 7/1992 | Yu et al. | 356/369 |
| 5,151,584 A | 9/1992 | Ebbing et al. | 250/201.4 |
| 5,346,582 A * | 9/1994 | Yachi | 438/9 |
| 5,362,356 A | 11/1994 | Schoenborn | 156/626 |
| 5,395,769 A * | 3/1995 | Atienzo et al. | 438/9 X |
| 5,450,205 A | 9/1995 | Sawin et al. | 356/382 |
| 5,499,733 A | 3/1996 | Litvak | 216/38 |
| 5,503,707 A | 4/1996 | Maung et al. | 156/626.1 |
| 5,564,830 A | 10/1996 | Böbel et al. | 374/126 |
| 5,658,418 A * | 8/1997 | Coronel et al. | 438/9 X |
| 5,756,400 A | 5/1998 | Ye et al. | 438/710 |

* cited by examiner

US 6,406,924 B1

ENDPOINT DETECTION IN THE FABRICATION OF ELECTRONIC DEVICES

CROSS-REFERENCE

This application is a continuation-in-part of U.S. Pat. application Ser. No. 09/062,520, entitled "Improved Endpoint Detection for Semiconductor Processes," filed on Apr. 17, 1998, which is incorporated herein by reference.

BACKGROUND

The present invention relates to the detection of an endpoint during processing of a substrate.

In the fabrication of devices for electronic applications, semiconductor, dielectric and conductor materials, such as for example, polysilicon, silicon dioxide, and metal containing layers, are deposited on a substrate and etched to form features such as patterns of gates, vias, contact holes and interconnect lines. These features are typically formed by chemical vapor deposition (CVD), physical vapor deposition (PVD), oxidation and etching processes. For example, in a typical etching process, a patterned mask of photoresist or oxide hard mask is formed on a deposited layer by photolithographic methods and exposed portions of the deposited layer are etched by an energized halogen gas, such as $Cl_2$, HBr and $BCl_3$. In a typical CVD process, a gas provided in the chamber is decomposed to deposit a layer on the substrate. In PVD processes, a target facing the substrate is sputtered to deposit the target material onto the substrate.

One problem with conventional deposition and etching processes is that it is difficult for the operator to determine when to end the process. For example, in deposition processes, it is sometimes desirable to change process conditions to change the nature of the film being deposited on the substrate or to stop deposition after a desired film thickness has been obtained. In etching processes, it is often desirable to stop etching of a particular layer without etching through or otherwise damaging one or more underlayers, especially when the underlayer is thin, such as for example, a gate oxide underlayer below a polysilicon or silicon layer. It is also desirable to stop the etching process on the layer because the underlayer is easily damaged by impingement of energetic plasma species.

Endpoint detection methods are used to determine completion of a stage of the etching or deposition process. In one method, a change in the emission spectra of a plasma is analyzed to determine a compositional change in a layer being deposited or etched, for example, one that occurs after a layer is etched through and an underlayer having a different chemical composition is exposed, as for example, taught in U.S. Pat. No. 4,328,068, which is incorporated herein by reference. However, conventional plasma emission methods detect a process endpoint only after the layer has been etched through and the underlayer exposed, and exposure to the plasma can damage the underlayer. Also, changes in the intensity of the plasma and absorption of selected wavelengths of the plasma emission by the chamber window reduces detection accuracy.

In another endpoint measurement method, known as interferometry, a light beam directed onto a layer on a substrate is partially reflected from the surface of the layer, and partially transmitted through the layer and reflected by one or more underlayers, substantially throughout the process being conducted on the substrate. Constructive and destructive interference of the multiple reflections give rise to an interference pattern which undergoes periodic maxima and minima depending upon the path length of the radiation through the thickness of the layer being processed on the substrate. Before processing of the substrate, an initial thickness of the layer is assumed or measured. During processing, the observed periodic maxima and minima of a measured interference pattern is directly correlated to a calculated reduction in thickness of the layer (which would result in a changing pathlength of the radiation transmitted through the layer being processed) to estimate an endpoint of the process. However, this process requires an accurate knowledge of the initial thickness and refractive index of the layer being etched, which are often difficult to obtain and which can change across the surface of a substrate or from one substrate to another. Inaccurate measurements of either the initial thickness or refractive index of the layer throws off the entire detection method because the calculation of the residual thickness of the layer (from the periodic maxima and minima of the detected interference fringes) will lead to an erroneous estimate of the final thickness of the layer. In addition, variations in the thickness and refractive index of the layer that normally occur in manufacturing will require accurate measurement of these parameters for each and every substrate that is etched or deposited upon, which is an impractical solution. Thus, this method has limited utility, especially for measuring residual thickness of polysilicon layers that are superimposed on thin gate oxide layers, because the margin of error is very small due to the thinness of the underlying gate oxide layer.

In yet another endpoint detection method, known as ellipsometry, a polarized light beam that is at least partially reflected from a layer being processed on a substrate is analyzed to determine changes in the phase and magnitude of the reflected light beam that occur as the layer is being processed, as for example disclosed in U.S. Pat. Nos. 3,874,797 and 3,824,017, both of which are incorporated herein by reference. However, it is difficult to obtain accurate measurements of the thickness of a layer on the substrate without using a polarized light beam having multiple wavelengths, as for example, described in Multiwavelength Ellipsometry for Real-Time Process Control of the Plasma Etching of Patterned Samples, Maynard Layadi and Tseng-Chung Li, *J. Vac, Sci. Technol. B.* 15(1), January/February 1997. The multiple wavelengths and complex phase and magnitude measurements are difficult to make. In addition, deposits formed on the window of the chamber change the polarization of the light beam passing through the window which can result in erroneous ellipsometric measurements.

Thus, it is desirable to have an endpoint detection method that detects a change in a stage of a process being conducted on a substrate immediately before or after processing of the layer is completed and without damaging underlayers. It is further desirable to have an endpoint detection apparatus that provides a detection signal prior to etching through or deposition of a layer to allow the etching or deposition process to be changed at a suitable time. It is also desirable to have an endpoint measurement system which measures remaining thickness or a change in thickness of a layer being processed, with high resolution, low signal to noise ratio and independent of the strength of the radiation transmitted through the chamber.

SUMMARY

Embodiments of the present invention satisfy the above identified needs, in principle, by detecting an endpoint during processing of a substrate with accuracy and repeatability. In one embodiment, the present invention comprises a chamber for processing a substrate, the chamber comprising a radiation source capable of emitting radiation having a wavelength that is substantially absorbed in a predetermined pathlength in a thickness of the layer and a radiation detector adapted to detect the radiation. In another embodiment, the chamber further comprises a filter in a path of the radiation, the filter adapted to selectively pass through the radiation.

In another aspect, the present invention relates to a method of processing a substrate, in which, the substrate is placed in a process zone, and process conditions are maintained in the process zone for processing a layer on the substrate, the process conditions including, without limitation, one or more of gas composition, gas flow rate, an operating power level of a gas energizer, gas pressure and temperature. Radiation having a wavelength that is absorbed in a predetermined pathlength of a thickness of the layer being processed on the substrate is provided. A change in the radiation is detected after processing of a predetermined thickness of the layer.

The method is particularly useful for etching a layer on a substrate, in which, the substrate is placed in a process zone which is maintained at process conditions suitable for etching the layer. Radiation is provided on the substrate, the radiation having a wavelength that is substantially absorbed in a predetermined pathlength in a thickness of the layer being etched on the substrate. A change in the radiation is detected.

In yet another aspect, the present invention relates to a method of selecting a wavelength for determining an endpoint of a process being performed on a substrate, the method comprising the step of determining a wavelength of a radiation characterized in that when the radiation having the wavelength is incident on the substrate and upon approaching the endpoint of the process, there occurs a detectable change in intensity of the reflected radiation that arises from a transition between substantial absorption of the radiation by the layer being processed on the substrate to at least partially reflection by one or more underlayers on the substrate.

In yet another aspect, the present invention comprises a method of etching a layer on a substrate in a chamber, the method comprising the steps of placing the substrate in the chamber; providing in the chamber, a process gas comprising etchant gas and cleaning gas, and maintaining process conditions to etch the layer on the substrate and simultaneously clean a surface of the chamber; and prior to etching through the layer, changing the composition of the process gas to remove the cleaning gas.

In yet another aspect, the present invention relates to an apparatus for detecting an endpoint of a process being performed on a layer on a substrate. The apparatus comprises a radiation source capable of emitting a radiation having a wavelength that is substantially absorbed in a predetermined pathlength in a thickness of a layer on the substrate, and a radiation detector adapted to detect the radiation and generate a signal. The apparatus further includes a memory comprising a computer-readable medium having a computer-readable program embodied therein, the computer readable program including a set of instructions to detect a change in the signal to determine the endpoint of the process.

In yet another aspect, the present invention relates to a substrate processing apparatus comprising a chamber having a support adapted to support a substrate in the chamber, a gas delivery system adapted to introduce gas into the chamber, a plasma generator adapted to energize the gas in the chamber, an exhaust comprising a throttle valve adapted to control the pressure of gas in the chamber, and a controller adapted to control one or more of the gas delivery system, plasma generator, or throttle valve, to change a process condition in the chamber in relation to an endpoint signal. The apparatus further includes an endpoint detection system comprising a radiation source capable of emitting radiation having a wavelength that is substantially absorbed in a predetermined pathlength in a thickness of the layer, and a radiation detector adapted to detect the radiation and generate a signal. A memory is coupled To the controller of the chamber, the memory comprising a computer-readable medium having a computer-readable program embodied therein for directing operation of the substrate processing apparatus. The computer readable program includes a set of instructions to detect a change in the signal to determine an endpoint of the process and provide an endpoint signal to the controller.

DRAWINGS

These and other features, aspects, and advantages of the present invention will be better understood from the following drawings, description and appended claims, which illustrate examples of the invention. While the description and drawings below illustrate exemplary features of the invention, it is to be understood that each of the features can be used in the invention in general, not merely in the context of the particular drawing, and the invention includes any combination of these features.

Figure 14A:
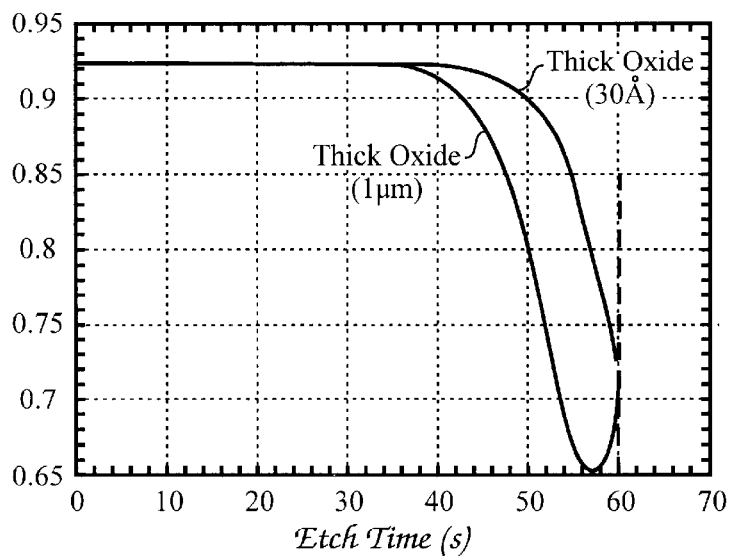
Figure 14B:
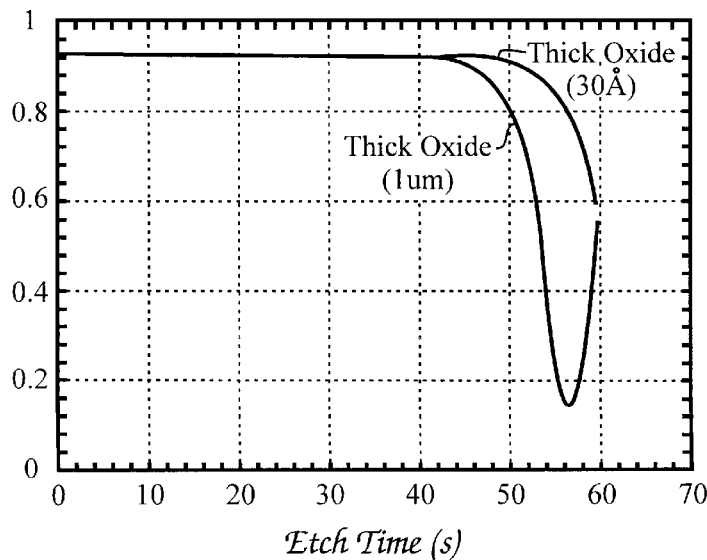

FIG. 14a is a graph showing a calculated trace of the intensity of radiation having a preselected wavelength of 2537 angstroms that is at least partially reflected from a substrate comprising an aluminum layer over a silicon dioxide layer on silicon; and FIG. 14b is a graph showing a calculated trace of the intensity of radiation having a preselected wavelength of 3650 angstroms that is at least partially reflected from the substrate of FIG. 14a.

DESCRIPTION

Figure 1A:
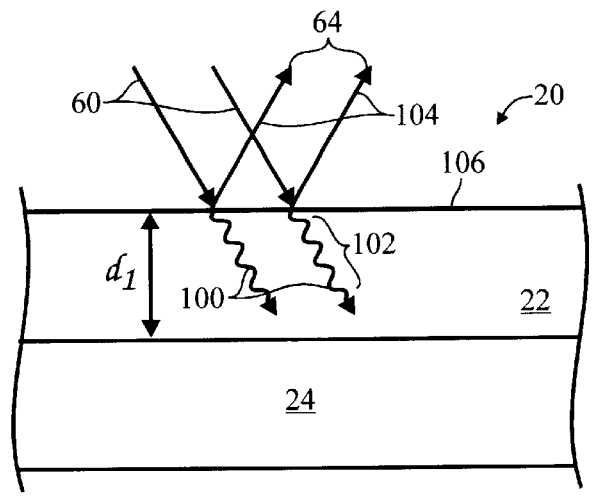
FIG. 1a is a schematic sectional view of a substrate having a layer that at least partially absorbs radiation having a predetermined wavelength and partially reflects the radiation.
Figure 1B:
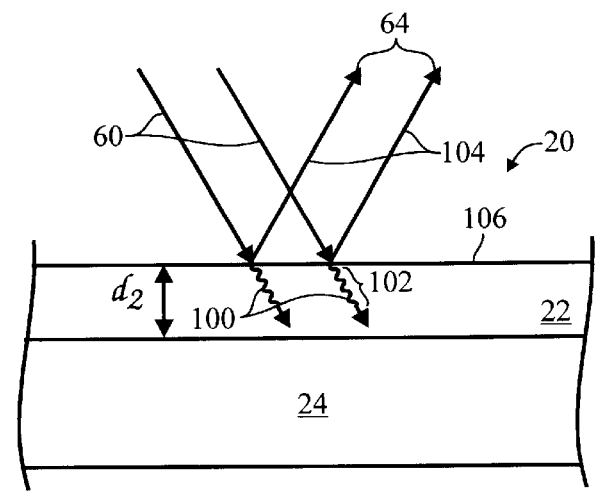
FIG. 1b is another view of the substrate of FIG. 1a, after a portion of the layer on the substrate is etched showing continued absorption of the radiation in the layer.
Figure 1C:
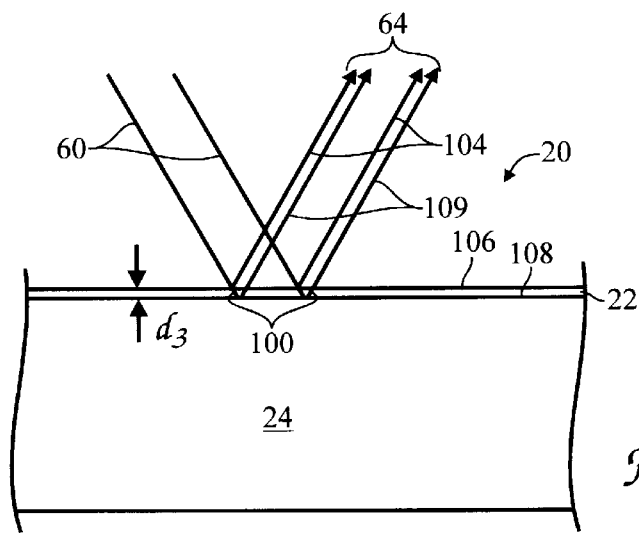
FIG. 1c is another view of the FIG. 1b, after partial completion of etching of the layer on the substrate when the radiation is at least partially transmitted through the etched layer and at least partially reflected from one or more underlayers.

The present invention is useful for detecting completion of a process stage or an endpoint of a process, such as a deposition process or an etching process, which is used to deposit or etch features from semiconductor, dielectric, or metallic conductor materials on a substrate 20. By substrate 20 it is meant an underlying support. such as a wafer of silicon, compound semiconductor, or dielectric, having thereon a plurality of layers 22, 24 such as for example, the structure illustrated in FIG. 1a. When etching the layers 22 on the substrate 20 in a typical etching process, it is desirable to stop etching upon reaching or before reaching the underlayer 24, as illustrated in FIGS. 1a through 1c. Alternatively, when depositing a layer 22 on the substrate 20 it is desirable to stop deposition upon reaching the desired thickness of the layer 22. The present invention is also useful for detecting completion of stages in chemical vapor deposition (CVD) and physical vapor deposition (PVD) processes, for example, when depositing a layer having a fixed thickness or when changing from deposition of a secondary or nucleation layer to deposition of a primary or growth layer. While examples are provided to illustrate the principles of the invention, the present invention should not be limited to the examples provided herein, and includes all applications that would be apparent to one of ordinary skill in the art.

Figure 2:
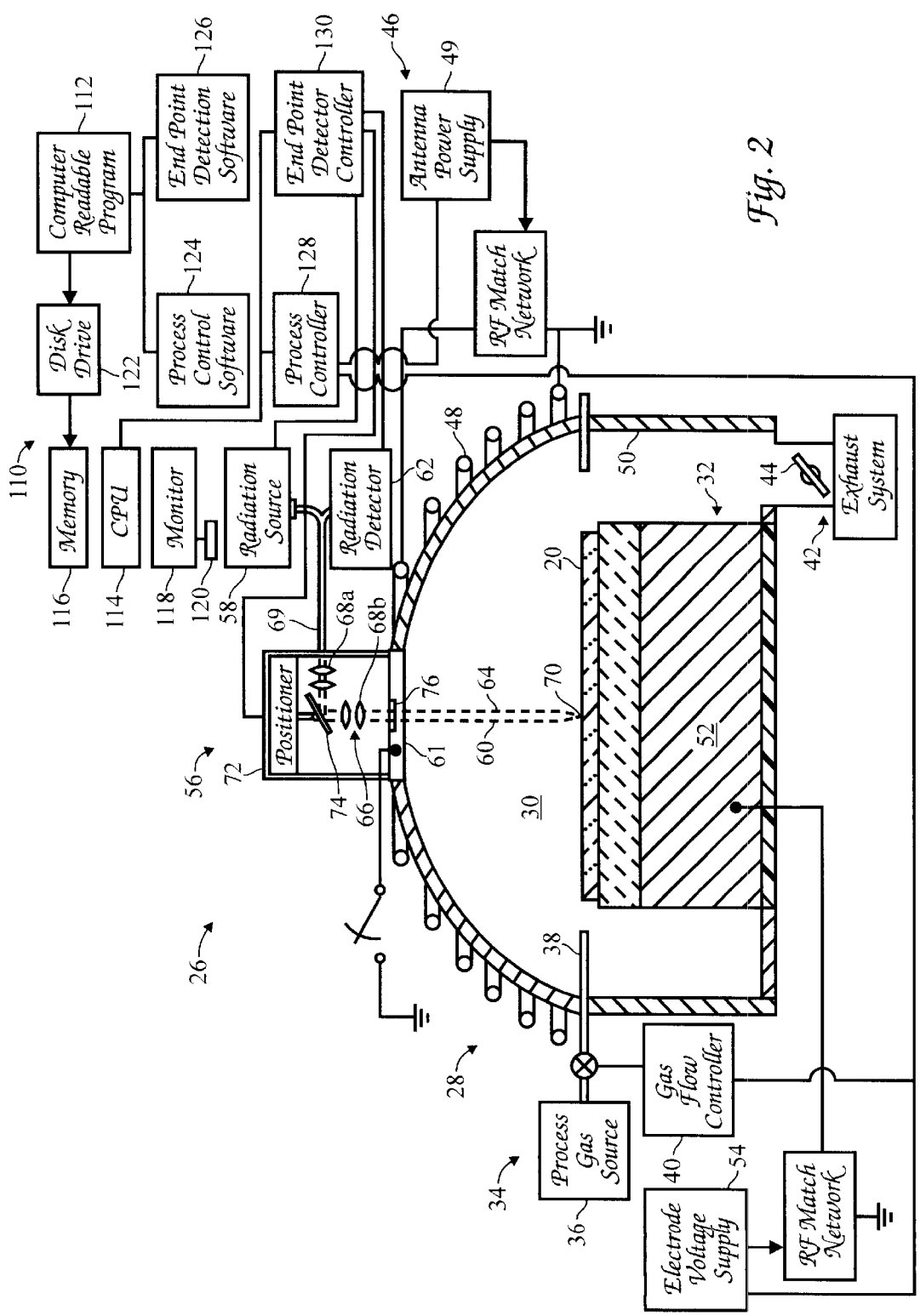
FIG. 2 is a schematic sectional side view of a chamber and endpoint detection system according to the present invention.

In an illustrative etching process, the substrate 20 is etched in an apparatus 26 schematically shown in FIG. 2. The apparatus 26 comprises a chamber 28 having a process zone 30 for processing the substrate 20 and a support 32 that supports the substrate 20 in the process zone 30. Process gas is introduced into the chamber 28 through a gas delivery system 34 comprising a process gas supply 36, gas outlets 38 located around the periphery of the substrate 20 (as shown) or in a showerhead mounted on the ceiling of the chamber (not shown), and a gas flow controller 40 for controlling the flow rate of the process gas. Spent process gas and etchant byproducts are exhausted from the chamber 28 through an exhaust 42 comprising roughing and turbomolecular pumps (not shown) and a throttle valve 44 to control the pressure of process gas in the chamber 28.

An energized gas or plasma is generated from the process gas by a plasma generator 46 that couples RF or microwave energy to the process gas in the process zone 30 of the chamber 28, such as for example, an inductor antenna 48 comprising one or more coils powered by an antenna power supply 49 that inductively couple RF energy to the chamber. In addition, a first process electrode 50 such as an electrically grounded ceiling or sidewall of the chamber 28 and a second electrode 52 such as an RF biased support 32 below the substrate 20, can be used to further energize the gas in the chamber 28. The first and second electrodes 50, 52 are electrically biased relative to one another by an RF voltage provided by an electrode voltage supply 54. The frequency of the RF voltage applied to the inductor antenna 48 and the electrodes 50, 52 is typically from about 50 KHz to about 60 MHz and more typically about 13.56 MHz.

The chamber 28 further comprises an endpoint detection system 56 to detect an endpoint of a stage of the process being performed on the substrate 20. The endpoint detection system 56 comprises a radiation source 58 for emitting radiation from outside or inside the chamber 28. When the radiation source 58 is outside the chamber 28, the radiation 60 passes through a window 61 in the chamber to be incident on the substrate 20. The radiation source 58 provides radiation such as for example, ultraviolet, infrared or x-ray radiation. The radiation source 58 can provide radiation having only a predominant wavelength, such as a monochromatic light having primarily radiation at a single or a few wavelengths, for example, a He—Ne or Nd-YAG laser. Alternatively, the radiation source 58 can provide multiple wavelengths of radiation, such as polychromatic light, which are filtered to selectively pass through substantially only a single wavelength. Suitable radiation sources 58 for providing polychromatic light include Hg discharge lamps that generate a polychromatic spectrum of light having wavelengths in the range of from about 200 to about 600 nanometers, arc lamps such as xenon or Hg—Xe lamps and tungsten-halogen lamps; and light emitting diodes (LED). The radiation source 58 can also comprise an emission from a plasma generated inside the chamber 28, the plasma emission being generally multispectral, i.e., providing radiation having multiple wavelengths across an entire spectrum.

In certain processes, it is preferred to have a radiation source 58 that provides nonpolarized radiation, such as for example, unpolarized light. One reason is that variations in the intensity of polarized radiation reflected from the substrate 20 can be masked by changing absorption characteristics of the energized gas or plasma. In addition, the state of polarization of the radiation also influences its absorption in materials having oriented crystalline structures, such as crystals having other than cubic symmetry. Also, the polarization state of the radiation can change when it passes through a thin residue film that deposits on the window 61 of the chamber 28 during the process, and the polarization state also changes as the thickness of the residue film increases, which gives rise to erroneous measurements. Thus, for certain processes, depending on the process gas composition and the location of the source of radiation, it may be preferred to use a radiation source 58 providing unpolarized radiation. A normal incidence of the radiation onto the substrate 20 can reduce such effects. Normal incidence also provides a more accurate endpoint reading for a substrate 20 having tall and narrowly spaced features, such as resist features, over the layers 22, 24, because the normally incident radiation is not blocked from reaching the layers 22, 24 by the height of the resist features. However, it should be understood that normal incidence is not necessary for detection of the reflected radiation and that other angles of incidence may be employed.

The endpoint detection system 56 further comprises a radiation detector 62 for detecting radiation 64 reflected by the substrate 20. The radiation detector 62 comprises a radiation sensor, such as a photovoltaic cell, photodiode, photomultiplier, or phototransistor, which provides an electrical output signal in response to a measured intensity of radiation 64. The signal can comprise a change in the level of a current passing through an electrical component or a change in a voltage applied across an electrical component. A suitable system for coupling the radiation detector 62 to the chamber 28 comprises a fiberoptic cable 69 leading from the chamber 28 to the sensor of the radiation detector 62.

Optionally, a lens assembly 66 is used to focus radiation emitted by the radiation source 58 onto the substrate 20 and/or to focus radiation 64 at least partially reflected back from the layers 22, 24 on the substrate 20 onto the sensor of the radiation detector 62. For example, for a radiation source 58 comprising a Hg-discharge lamp located outside the chamber 28, as shown in FIG. 2, a plurality of convex lenses 68a, 68b can be used To focus radiation from the lamp through the window 61 and onto a beam spot 70 on the substrate 20. The area of the beam spot 70 should be sufficiently large to provide an accurate measurement of the surface topography of the substrate 20. The lenses 68a, 68b can also be used to focus reflected radiation 64 back onto the sensor of the radiation detector 62.

Optionally, a positioner 72 is used to scan the incident radiation 60 across the substrate surface to locate a suitable portion of the substrate 20 on which to "park" the beam spot 70. The positioner 72 comprises one or more primary mirrors 74 that rotate at small angles to deflect radiation from the radiation source 58 onto different positions of the substrate surface (as shown). Alternatively, the mirrors 74 can also direct radiation emitted from a plasma emission and at least partially reflected off the layers 22, 24 on the substrate 20 back onto the radiation detector 62. Additional secondary mirrors (not shown) can be used to intercept and focus reflected radiation back on the radiation detector 62. The positioner 72 can also be used to scan the radiation in a raster pattern across the substrate 20. In this version, the positioner 72 further comprises a movable stage (not shown) upon which the radiation source 58, lens assembly 66, and radiation detector 62 are mounted. The movable stage can be moved through set intervals by a drive mechanism, such as a stepper motor, that scans or otherwise moves the beam spot 70 across the substrate 20.

Radiation having a plurality of wavelengths, such as polychromatic light from a lamp or a plasma emission spectra, can be suitable filtered by placing a filter 76 in the path of the incident or reflected radiation 60, 64. The filter 76 is typically located in the lens assembly 66 but can also be located at other positions in the chamber 28, for example, in the chamber window 61, in front of the radiation detector 62, or in front of the radiation source 58. A suitable filter 76 comprises a stack of thin films on a transparent support that selectively transmits radiation having the desired wavelength or a lens made from a material that selectively passes radiation having the desired wavelength. The filter 76 can also comprise a diffraction grating having a diffraction spacing that scatters radiation having undesirable wavelengths and allow radiation having the desired wavelength to pass through. Other suitable or equivalent filtering means, for example, attenuation of radiation through a long pathlength in a partially absorbing material, or selective electronic filtering of the signal from the radiation detector 62 to read only the portion of the signal corresponding to radiation having the desired wavelength, can also be used.

In the present method, radiation having a wavelength that is substantially absorbed in a predetermined pathlength within a thickness of the layer 22 being processed on the substrate 20, is selected for endpoint detection. The principles of the present invention can be explained as follows. Generally, when an optically absorbing layer 22 (medium 1) lies on an underlayer 24 (medium 2), its absorption/reflectivity can be approximately described by a summation equation. The radiation in the process environment (medium zero) in the chamber 28 that is incident on the layer 22 (medium 1) has a first surface reflection determined by the complex Fresnel coefficient $r_1=(n_0-n_1)/(n_0+n_1)$ where $n_0$ and $n_1$ are the complex refractive indices of media 0 and 1. The complex refractive index n is defined as $n=n-ik$ where n and k are the real and imaginary parts, being the refractive index and extinction coefficient, respectively. Radiation not reflected by the layer 22 is transmitted into the layer 22 according to the complex Fresnel transmission coefficient $t_1=2n_0/(n_0+n_1)$. Transmitted radiation is then absorbed in the layer 22 (medium 1) as a function of its depth d by the factor $\exp(-4\pi k_1 d/\lambda)$ where $\lambda$ is the wavelength of the incident radiation. If the incident radiation has not been fully absorbed before reaching the rear of the layer 22 some of the radiation is reflected back according to the equation, $r_2=(n_1-n_2)/(n_1+n_2)$, where $n_2$ is the complex refractive index for layer 22 (medium 2). The part of the reflection which remains after absorption during the round trip is transmitted back into medium (0), where it combines with the original reflection, but with a phase change $\delta=2\pi n_1 d_1/\lambda$ which depends upon the round trip distance covered. The net reflected amplitude is approximately, $r_{net}=r_1+t_1 t_1' r_2 \exp(+2i\delta)\exp(-4\pi k_1 d/\lambda)$, where multiple reflections have been neglected. Explicit formulations may be found in references such as M. Born and E. Wolf, *Principles of Optics,* Pergamon Press (1965), which is incorporated herein by reference. When d and $k_1$ are large enough, absorption dominates and the second term is zero, producing a constant net reflection as a function of thickness d. Once d becomes sufficiently small, however, absorption no longer dominates and the net reflection is no longer constant as d is varied. This variation comes from the changing phase and magnitude of the second term as d is changed. Depending on the magnitude of $k_1$, the variation in total reflected intensity with $d_1$ can appear periodic, with an increasing amplitude as $d_1$ tends to zero, or simply have a characteristic feature or signature, such as for highly absorbing metal layers 22.

These complex attributes of the reflected and absorbed radiation and their dependency upon the changing thickness of the layer 22 can be illustrated by the simplified representations of FIGS. 1a through 1c. Referring to FIG. 1a, initially, a component 100 of the radiation 60 that is incident on the layer 22 is substantially absorbed in a predetermined pathlength 102 in a thickness $d_1$ of The layer 22 and a component 104 is reflected from a surface 106 of the layer 22. The pathlength 102 necessary for substantial absorption of the component 100 depends upon the wavelength λ of the radiation 60, the incident angle, and the extinction coefficient k of the material making up the layer 22, as described above. For example, the component 100 can be substantially absorbed while traveling through a distance of a pathlength 102 that is less than the thickness $d_1$ of the layer 22, as illustrated schematically in FIG. 1a. The pathlength 102 in which the component 100 of the radiation is substantially absorbed can also be larger than the thickness $d_1$ of the layer 22, for example. the component 100 can travel through the thickness $d_1$ of the layer 22, be reflected back by the interface 108, and thereafter be absorbed while traveling a second time through the thickness $d_1$ of the layer 22. As another example, the component 100 could also be reflected back by the interface 108, travel through the thickness $d_1$ of the layer 22 a second time, and subsequently be reflected back into the layer 22 by the surface 106, and so on via means of multiple internal reflections.

During processing, the thickness of the layer 22 changes and becomes thinner as it is etched in the etching process. However, the radiation component 100 continues to be absorbed even in the thinner layer 22 having the smaller thickness of $d_2$, as illustrated in FIG. 1b. While not essential for operation of the present method, continued absorption of the component 100 into the thinner and partially etched layer 22 during processing reduces the possibility of erroneous signal interpretation or endpoint detection. Also, interpretation of the intensity of the summed reflected radiation 64 that is detected by the radiation detector 62 is less complex and is easier to perform when there is a significant change in signal intensity over a relatively short time period toward the end of a particular process stage. While the component 100 is illustrated as being substantially absorbed while traveling through a distance of a pathlength 102 that is less than the thickness $d_2$ of the layer 22, the pathlength 102 of substantially absorption can also be larger than the thickness $d_2$ of the layer 22, as discussed before.

Now referring to FIG. 1c, toward the end of the process being performed on the substrate 20, the component 100 of the radiation 60 is now transmitted through the remaining thickness $d_3$ of the etched layer 22 on the substrate 20, which is now much smaller than the predetermined absorption pathlength 102, and is at least partially reflected by the interface 108 between the layer 22 and the underlayer 24 to provide a secondary component 109 of reflected radiation. While numerous other reflections and refractions occur across the layer 22 at this stage, in a simplified representation, the secondary component 109 (which is reflected from the interface 108 of the layers 22, 24) constructively or destructively interferes with the primary component 104 (which is reflected from the top surface 106 of layer 22) to provide a summed intensity of reflected radiation 64 which is detectable by the radiation detector 62. In addition, if the layer 24 is transparent (gate oxide layers can be transparent) additional components will reflect from other interfaces that lie below The interface 108 (not shown in FIG. 1c).

Empirically Determined Absorption Trace for Endpoint Detection

Figure 3:
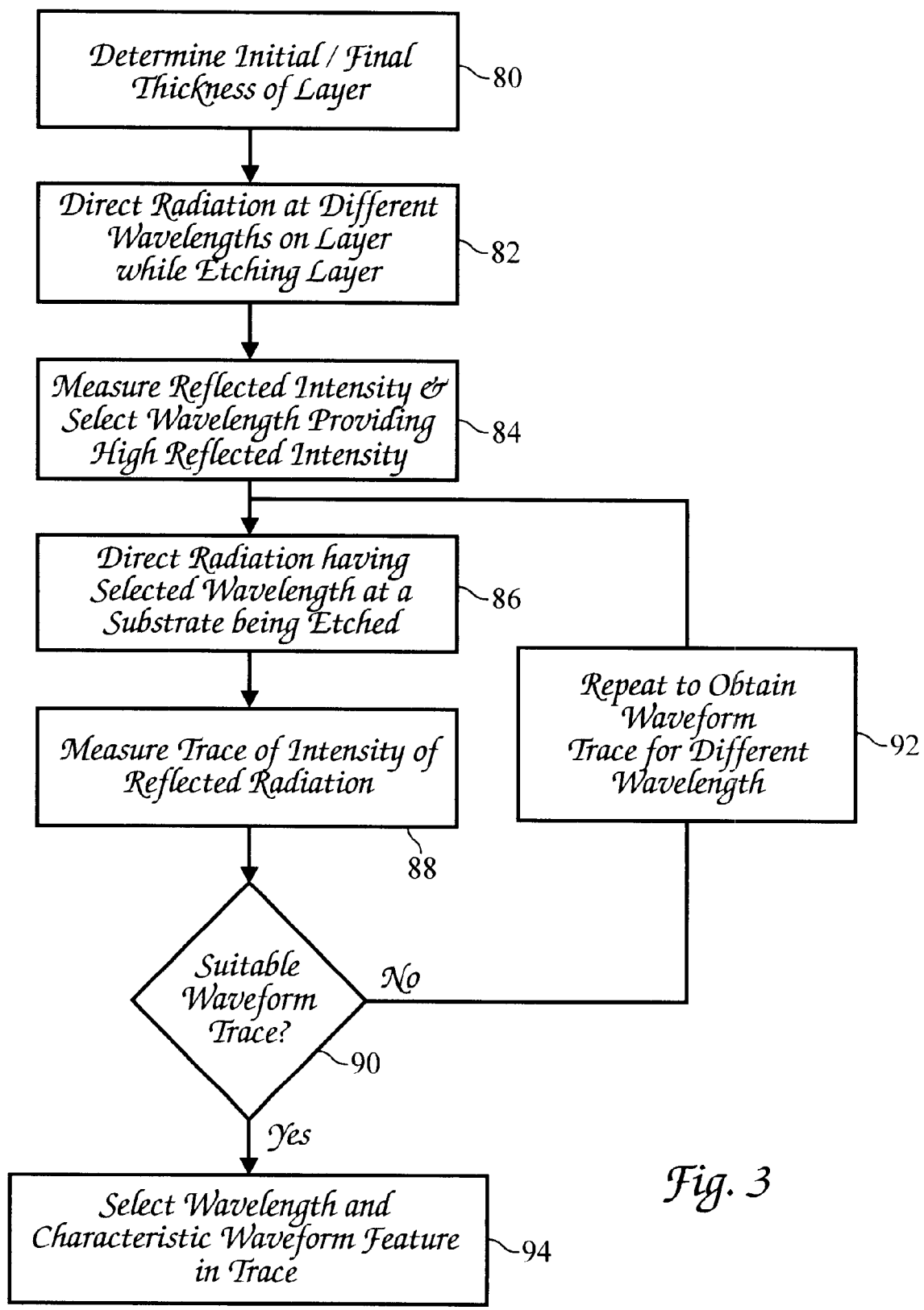
FIG. 3 is a flowchart of a process for selecting a suitable radiation having the desired wavelength.

Radiation having a suitable wavelength 64 for use in the endpoint detection process can be selected from empirically measured traces of the intensity of radiation having different wavelengths that are initially absorbed in and later transmitted through the layer 22 and at least partially reflected by one or more underlayers 24. This is done by performing a series of experimental process runs and detecting the absorption trace of radiation having different wavelengths in the layer 24 of the substrate 20 as illustrated in the flowchart of FIG. 3. In the first step 80, a thickness measuring machine, such as a model UV1050 available from KLA-TENCOR. Santa Clara, Calif., was used to accurately determine the thickness of the layer 22 to be deposited upon or etched from the substrate 20. The final thickness of the layer 22 was also used to estimate the overall operating time of the process.

Figure 4:
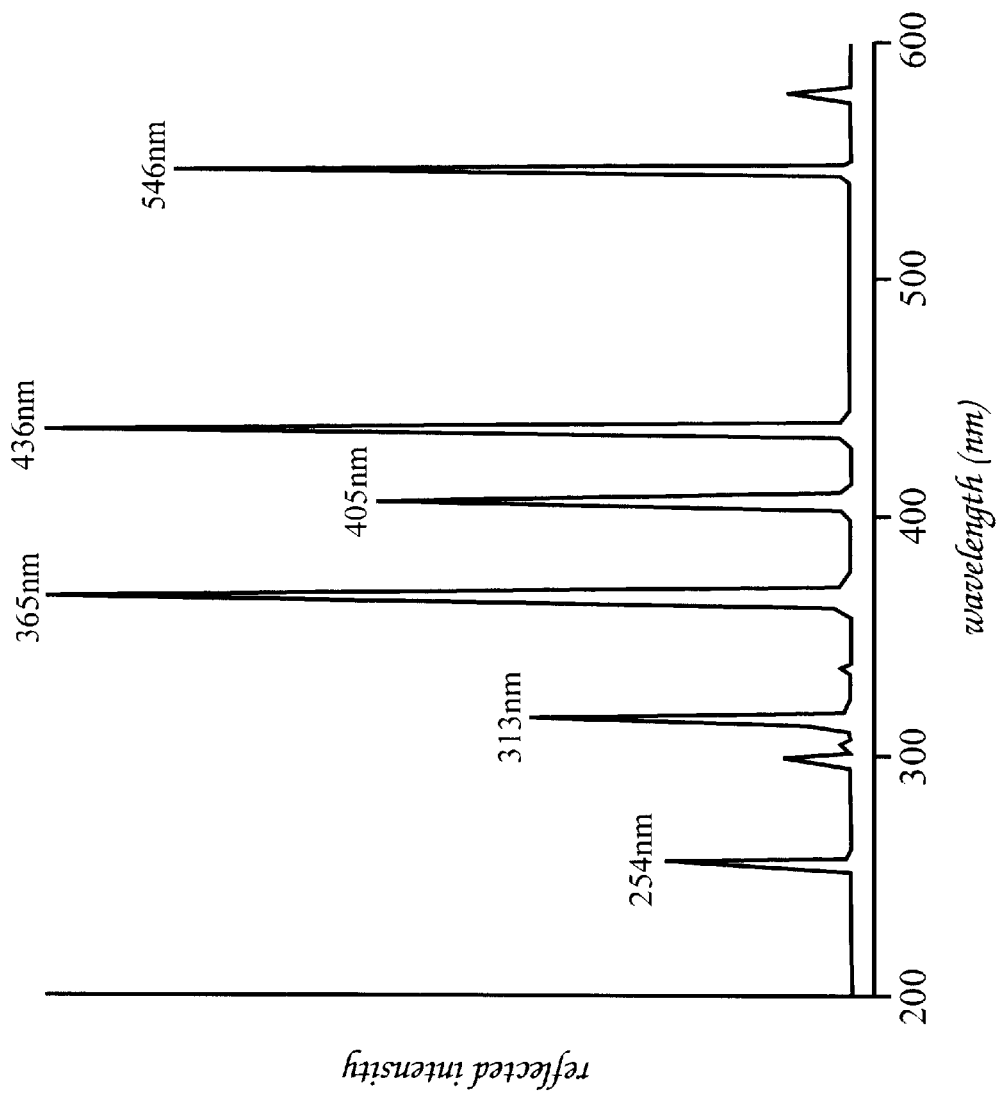
FIG. 4 is a graph of the intensity peaks of different wavelengths of radiation originating from an emission spectra of a Hg lamp and at least partially reflected from a layer on a substrate.

In the next step 82, a number of substrates were etched in the chamber 28 while different wavelengths of radiation were irradiated on the substrate 20. The substrates 20 comprised a 500 nm polysilicon layer 22 deposited on a 100 nm silicon dioxide underlayer 24. The peak intensity of the reflected radiation 64 that occurs approaching the endpoint of the etching of a layer 22 on the substrate 20 was measured by a radiation detector 62, as provided in step 84. These process runs were performed using a radiation source 58 providing polychromatic light, such as a Hg-discharge lamp, which was focused on the substrate 20 at a near vertical angle. FIG. 4 shows an emission spectra of wavelengths emitted by the Hg lamp and at least partially reflected from the layers 22, 24 on the substrate 20. A bandpass filter or monochromater is used to select particular wavelengths from the emission spectra. Generally, it is desirable to select radiation that provides a low and constant intensity of reflected radiation 64 at the initial stages of the etching process to reduce errors caused by misinterpretation of change in the reflected intensity, and a high peak intensity at the etching endpoint to provide a large signal to noise ratio which improves detection of the signal. However, an empirical determination of the optimal wavelength may be desirable because the optimal wavelengths of the radiation depend upon the composition and the initial and final thicknesses of the layer 22.

Figure 5:
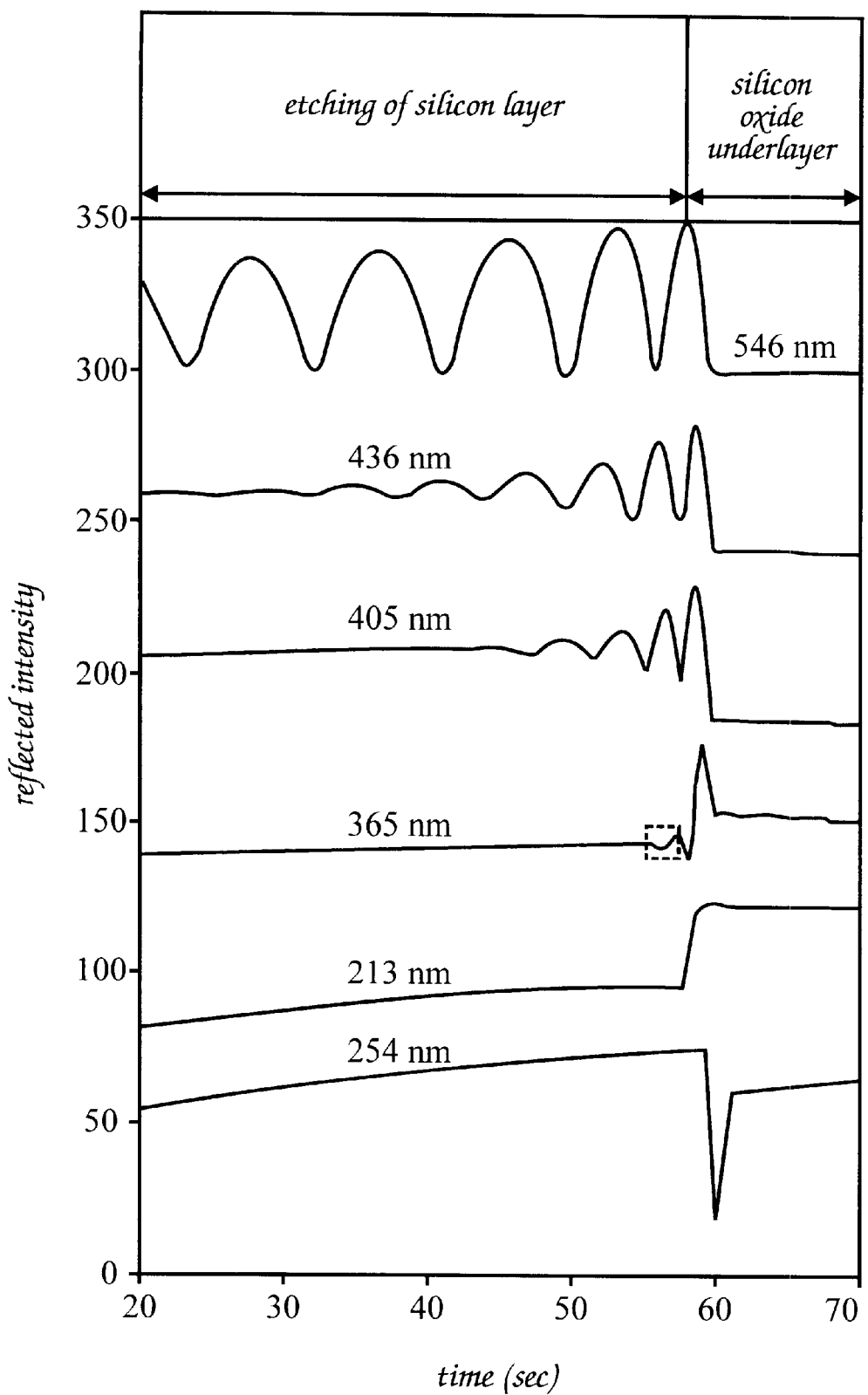
FIG. 5 is a graph of traces of the intensity of radiation having different wavelengths, originating from an emission spectra of a Hg lamp, that are at least partially reflected from a layer being etched on a substrate, showing the traces at particular wavelengths change as the thickness of the layer is reduced during etching.

In this example, the wavelengths of 254, 313, 365, 405, 436 and 546 nm, labeled above their corresponding peaks, were selected for further analysis. Thereafter, a trace of the intensity of the reflected radiation 64 for each of the selected wavelengths was measured during processing of the layer 22 on the substrate 20, as shown in steps 86 and 88. FIG. 5 shows different traces of the change in intensity of reflected radiation occurring during the etching process. An operator searches for a trace in which the intensity of the reflected radiation is substantially constant and absent periodic maxima and minima during most of the etching process, and that suddenly towards the end of the etching process, produces a strong change in reflected intensity. It is seen that for the lower wavelengths, as the thickness of the layer 22 that is being etched becomes smaller, the trace of the reflected radiation 64 changes from a constant level value—where essentially all the component 100 of the incident radiation 60 that is not reflected by the surface 106 of the layer 22 (as illustrated in FIGS. 1a and 1b) is being absorbed within the layer 22—to a trace having interference fringes caused by the multiple reflections occurring from the surfaces 106, 108 because the layer 22 is not absorbing the entire component 100 (as illustrated in FIG. 1c). For example, the trace of the reflected intensity of radiation having a wavelength of 254 nm is a relatively straight line for 20 to 58 seconds of etching time which indicates almost total absorption of the component 100 into the layer 22, followed by a single minima occurring at an endpoint of etching of the layer 22, when the component 100 is reflected by the interface 108 and interferes with the component 104 that is reflected from the surface 106 of the layer 22. Similarly, the trace of radiation having a wavelength of 313 nm comprises a level portion followed by a single step rise at the endpoint of etching of the layer 22. The trace at the 365 nm wavelength comprises a straight absorption line with a small dip immediately before the endpoint is reached and followed by a peak at the endpoint itself. At a wavelength of 405 nm and above, a number of oscillations with maxima and minima peaks occur before reaching the endpoint, indicating that the layer 22 being etched is less absorptive of radiation having these wavelengths and instead begins to transmit the radiation with the resultant occurrence of the multiple fringes, way before the actual endpoint is reached. Similarly, at wavelengths of 436 and 546 nm, a larger number of oscillations occur substantially before the end of the process. The concept of an exponential envelope can be seen where negligible absorption occurs at 546 nm but the magnitude of the interference fringes is rapidly dampened for wavelengths less than 435 nm.

From the traces shown in FIG. 5, a wavelength of radiation having a component 100 which is completely absorbed in the layer 22 during the etching process, and which is at least partially transmitted through the layer 22 and reflected from the interface 108 upon approaching the endpoint of the etching process, is selected for endpoint detection. If a suitable wavelength is not obtained, the process is repeated for other wavelengths, as shown in steps 90 and 92. In the present example, preferably, the radiation for detecting an endpoint for etching of the polysilicon layer 22 on the silicon dioxide underlayer 24, comprises a wavelength of less than about 600 nm, and more preferably from about 200 nm to about 600 nm.

The selected trace of the reflected intensity of radiation having the preferred wavelength is examined by an operator to determine a desired stopping point for the process being conducted on the substrate 20, and to locate its associated characteristic waveform feature in the endpoint trace, as provided in step 94. The desired stopping point can be determined in two ways. First, knowing the etching rate, the time to etch a desired thickness of the layer 22 can be estimated and subtracted from the total etch time to determine the endpoint time that leaves behind a desired remaining thickness of the layer 22. Second, the trace can be empirically analyzed for identifiable features that provide a desired endpoint time to recognize a feature of the trace as being associated with a remaining thickness of the layer 22. For example, even for strongly absorbing layers 22, the few fringes that may appear when the layer 22 is thin are still spaced apart by approximately $\lambda/2n$ (where $\lambda$ is the wavelength and n is the real part of the refractive index). Together with an offset thickness if the underlayer 24 is transparent (such as gate oxide), the desired stopping point can be determined by counting features back from the interface between the layer 22 and the underlayer 24. In either case, a second substrate 20 can be etched and stopped using the endpoint method, without applying a second process step; and the remaining thickness of the layer 22 can be measured. If the remaining thickness is different than desired, the process can be iterated to achieve the desired outcome. This is normally performed as part of "process tuning" to finalize a complete process for endpoint detection.

Figure 6A:
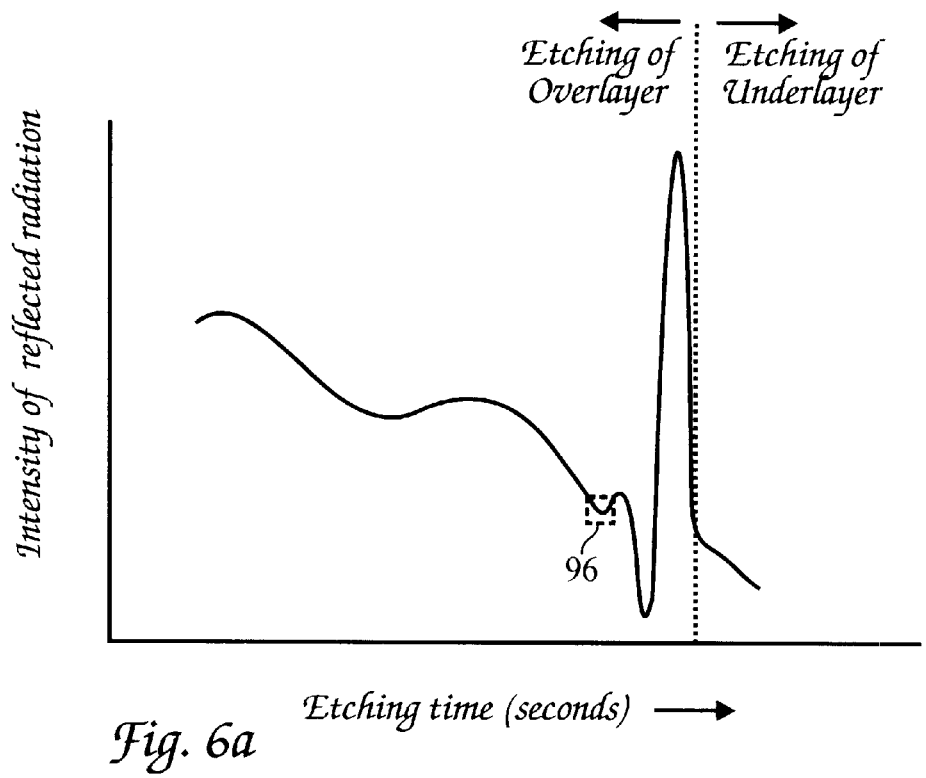
FIG. 6a and 6b are graphs showing traces of the intensity of radiation having a preselected wavelength that is absorbed in a layer being processed on the substrate, and during processing is least partially reflected from an underlayer on the substrate.
Figure 6B:
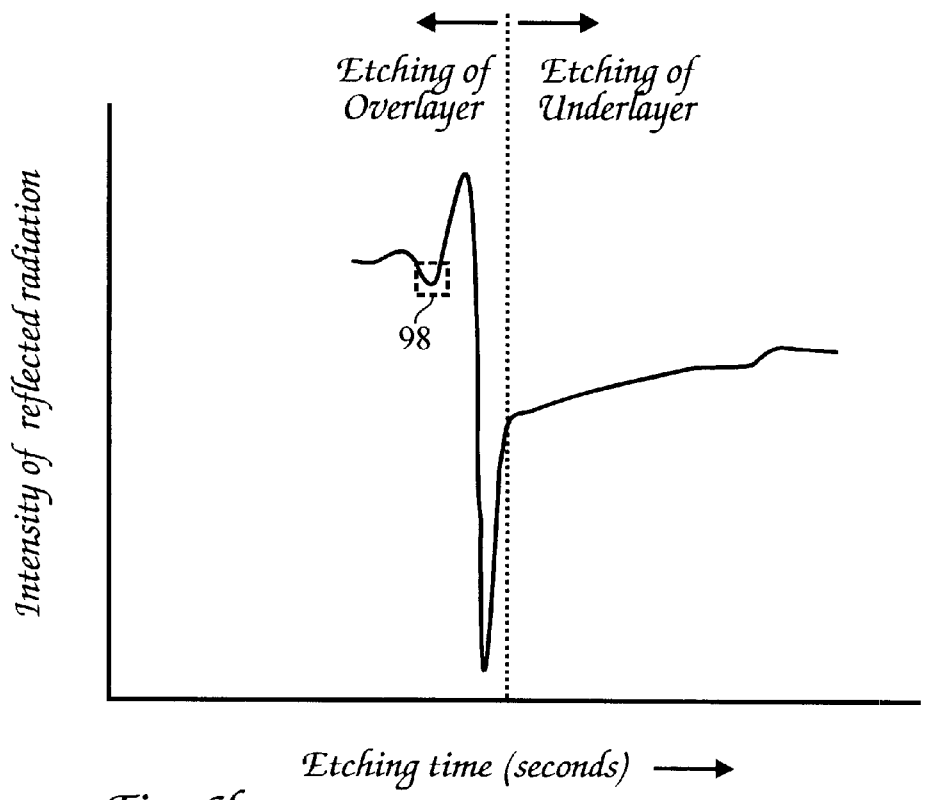

The selected characteristic waveform feature should also have distinct attributes that are easily recognizable even for reflected radiation that is attenuated or has a high signal to noise ratio in the chamber environment, In addition, the characteristic waveform should be sufficiently repeatable, from one substrate 20 to another, to reduce endpoint detection errors in processing of a large batch of substrates 20. The characteristic waveform features in the endpoint trace can be a peak, valley, slope or combination thereof. For example, FIGS. 6a and 6b show a portion of a waveform trace or spectra of a reflected radiation 64 having a wavelength of 365 nm that is close to the interface 108 of a polysilicon layer 22 deposited on a silicon oxide layer 24. The trace is for a substrate 20 with a patterned resist layer over a 5000 Å thickness of polysilicon 30 that overlies a relatively thick 1000 Å layer of silicon dioxide 22. The selected characteristic waveform comprises a small dip 96 that occurs before the small peak which is immediately in front of the large peak as shown in the inset box. The small dip is easily recognizable by and programmable into the computer program 112 for endpoint detection. In another example, FIG. 6b shows the reflected radiation 64 trace obtained for radiation also of the 365 nm wavelength at least partially reflected from a substrate 20 with a patterned resist layer formed over a 2000 Å undoped polysilicon layer 22 on a thin 65 Å silicon dioxide underlayer 24. The selected characteristic waveform feature comprises a small dip 98 in front of a relatively large peak signal, that is also highly recognizable and repeatable.

Controller and Computer System

The chamber and endpoint detection system 56 is operated by a chamber controller 110 that executes software of a computer-readable program 112 of a computer system comprising a central processor unit (CPU) 114, such as for example a 68040 microprocessor, commercially available from Synergy Microsystems, California, or a Pentium Processor commercially available from Intel Corporation, Santa Clara, Calif., that is coupled to a memory 116 and peripheral computer components. The memory 116 comprises a computer-readable medium having a computer-readable program embodied therein. Preferably, the memory 116 is a hard disk drive 122, but the memory can also be other kinds of memory, such as random access memory (not shown). In addition to memory 116, controller 110 can include a floppy disk drive 122 and a card rack. The interface between an operator and the controller 110 can be, for example, via a monitor 118 and a light pen 120, as shown in FIG. 2. The light pen 120 detects light emitted by the monitor 118 with a light sensor in the tip of the light pen 120. To select a particular screen or function, the operator touches a designated area of a screen on the monitor 118 and pushes the button on the light pen 120. Typically, the area touched changes color, or a new menu is displayed, confirming communication between the user and the controller 110. In the preferred embodiment, Two monitors 118 and light pens 120 are used, one mounted in a clean room for the operators and the other behind the wall for service technicians. Both monitors 118 simultaneously display the same information, but only one light pen 120 is enabled.

Other computer-readable programs such as those stored on other memory including, for example, a floppy disk or other computer program product inserted in a disk drive 122 or other appropriate drive, may also be used to operate controller 110. The computer system card rack contains a single-board computer, analog and digital input/output boards, interface boards, and stepper motor controller boards. Various components of the apparatus 26 conform to the Versa Modular European (VME) standard, which defines board, card cage, and connector dimensions and types. The VME standard also defines the bus structure having a 16-bit data bus and 24-bit address bus.

The computer program 112 generally comprises process control software 124 comprising a set of instructions of program code to operate the chamber 28 and its components, endpoint detection software 126 comprising a set of instructions for operating the endpoint detection system 56, safety systems software, and other control software. The computer-readable program can be written in any conventional computer-readable programming language, such as for example, assembly language, C, C++, Pascal, or Fortran. Suitable program code is entered into a single file, or multiple files, using a conventional text editor and stored or embodied in the computer-usable medium of the memory 116 of the computer system. If the entered code text is in a high level language, the code is compiled, and the resultant compiler code is then linked with an object code of pre-compiled library routines. To execute the linked, compiled object code, the user invokes the object code, causing the CPU 114 to read and execute the code to perform the tasks identified in the program.

The selected attribute of the predetermined characteristic feature is programmed into the endpoint detection software 126, which analyzes an incoming signal trace provided by the radiation detector 62 and determines a process endpoint when a desired set of criteria is reached, such as when an attribute of the detected signal is substantially alike to an attribute of the predetermined characteristic feature. The trace is provided to the controller 110 by an analog to digital converter board (not shown) in the radiation detector 62. The endpoint detection software 126 operates an endpoint detection controller 130 which sends signals to operate endpoint detection components such as the radiation source 58, radiation detector 62, and optionally the lens assembly 66, filter 76 and other components. The endpoint detection software 126 includes a set of instructions to detect an attribute of a characteristic feature of the signal to determine an endpoint of the process by, for example, detecting a change in intensity or a rate of change of intensity of the reflected radiation 64. The desired criteria are programmed into the endpoint detection software 126 to identify the endpoint using the preset stored parameters or algorithms.

Figure 7:
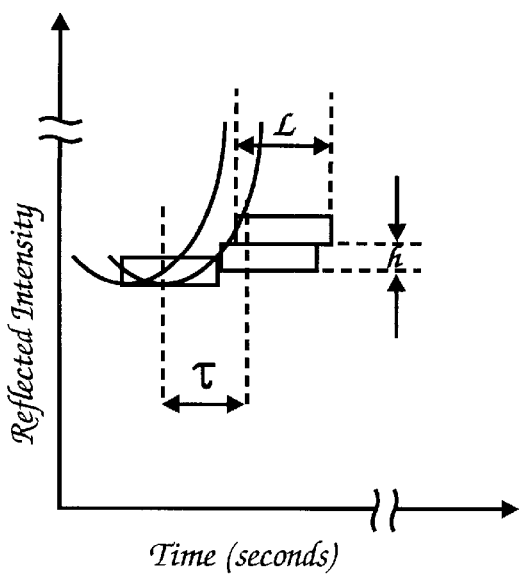
FIG. 7 is a graph showing a portion of a trace of radiation that is at least partially reflected from the substrate during processing of the substrate and analyzed using a series of boxes around the end of the trace to determine the process endpoint, each box having a preset signal height and time length.

In one method, while a substrate 20 is being processed, the measured trace is continuously analyzed by drawing a box around the end of the trace and back in time, with signal height and time length established in the algorithm, as shown in FIG. 7. A set of windows out is programmed to detect a valley in the trace of the reflected intensity. Taller windows could also be used to trigger on the upward slope to detect a later endpoint or set up to trigger on a downward slope to detect an endpoint before a valley in the trace. The first criterion is met when the signal of the trace becomes too steep and exits or moves out of the preprogrammed box ("WINDOW OUT") or when it becomes gradual and enters the box ("WINDOW IN"). Additional boxes or windows are sequentially applied on the moving trace to generate the complete set of criteria to make a determination on whether the change in signal in the trace is the endpoint of the process or is only noise. The direction of entering or exiting a box can also be specified as part of the criteria. A typical set of instructions for setting the programming functions of the box are shown in Table I.

TABLE I

Algorithm Number (1-62):1

| Etch Mode; Endpoint - Depth (Toggle) | ENDPNT | ENDPNT | NONE | NONE |
|---|---|---|---|---|
| Wavelengths [1,2] (2000–8000, 0 for NONE) | 3650 | 3650 | | |
| AGC Levels [1,2] (40%–60%, 0 for NONE) | 50 | NONE | | |

TABLE I-continued

Algorithm Number (1-62):1

| Etch Mode; Endpoint - Depth (Toggle) | ENDPNT | ENDPNT | NONE | NONE |
|---|---|---|---|---|
| AGC Time (5.0–600.0) | 5.0 | | | |
| Initial Dead Time (0.0–999,9) | 40.0 | | | |
| Window Height (−99.99–99.99) | 0.30 | −0.50 | −0.10 | −0.10 |
| WindowTime (0.1–99.9) | 1.0 | 1.0 | 10.0 | 10.0 |
| Number of Windows Out (1–99, 0 for NONE) | 3 | 3 | NONE | NONE |
| Number of Windows In (1–99, 0 for NONE) | NONE | NONE | NONE | NONE |
| Derivative Time (0.0–19.9) | 0.0 | | | |
| Over Etch (0%–999%) | 0 | | | |
| Display Start Level (10%–90%) | 50 | | | |
| Display Gain (1–200) | 20 | | | |
| Magnetic Field Period (0.1–5.0) | 1.0 | | | |
| Number of Field Periods to Average (0–50) | 1 | | | |
| Hi Pass Time Const (0.0–600.0) | 0.0 | | | |
| Lo Pass Time Const (0.0–600.0) | 0.0 | | | |

Figure 8:
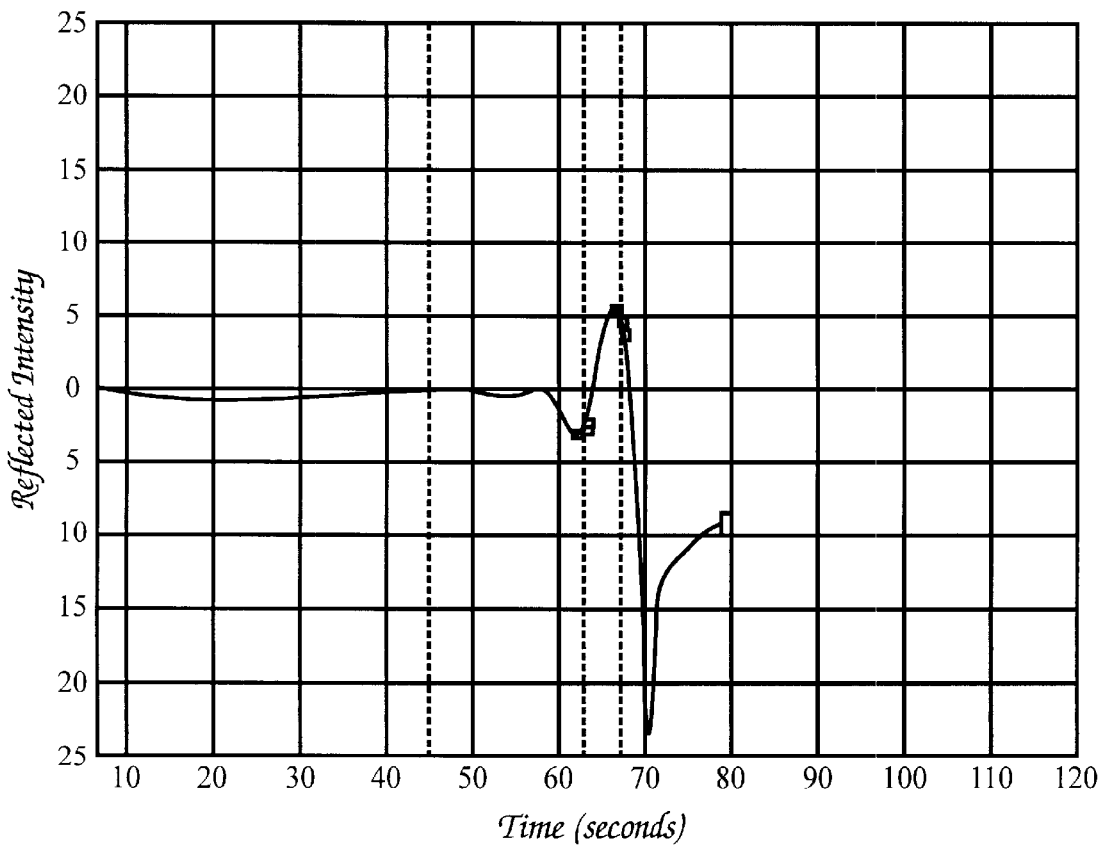
FIG. 8 is a graph showing a trace of the reflected intensity of radiation as analyzed in a series of boxes having a two-column criteria comprising windows exiting upward and downward.

In the example provided in Table I, an active endpoint would end a stage of the process being performed on the substrate 20 when the two-column windows-out criteria is established at 68 seconds. In the example shown in FIG. 8, an endpoint trace having a two-column criteria comprises windows exiting upward (at 62 sec) and windows exiting downward (at 68 sec) to ensure peak detection. In this example, the peak is associated with a remaining thickness of 220 Å of a polysilicon layer.

The moving-box signal analysis method is useful for discriminating between noise spikes and other spurious signals from the desired change of intensity of the reflected radiation 64 relied upon to determine the process endpoint, and to detect peaks, valleys, or absolute slope change, or a combination of these. The moving-box signal analysis method provides noise-immune slope detection ability and is described in U.S. Pat. No. 5,343,412 by Birang et al; and the software for multichannel and multichamber collection of signal traces is described in EP 458324 B1 by Cheng et al; both of which are incorporated herein by reference.

Figure 9:
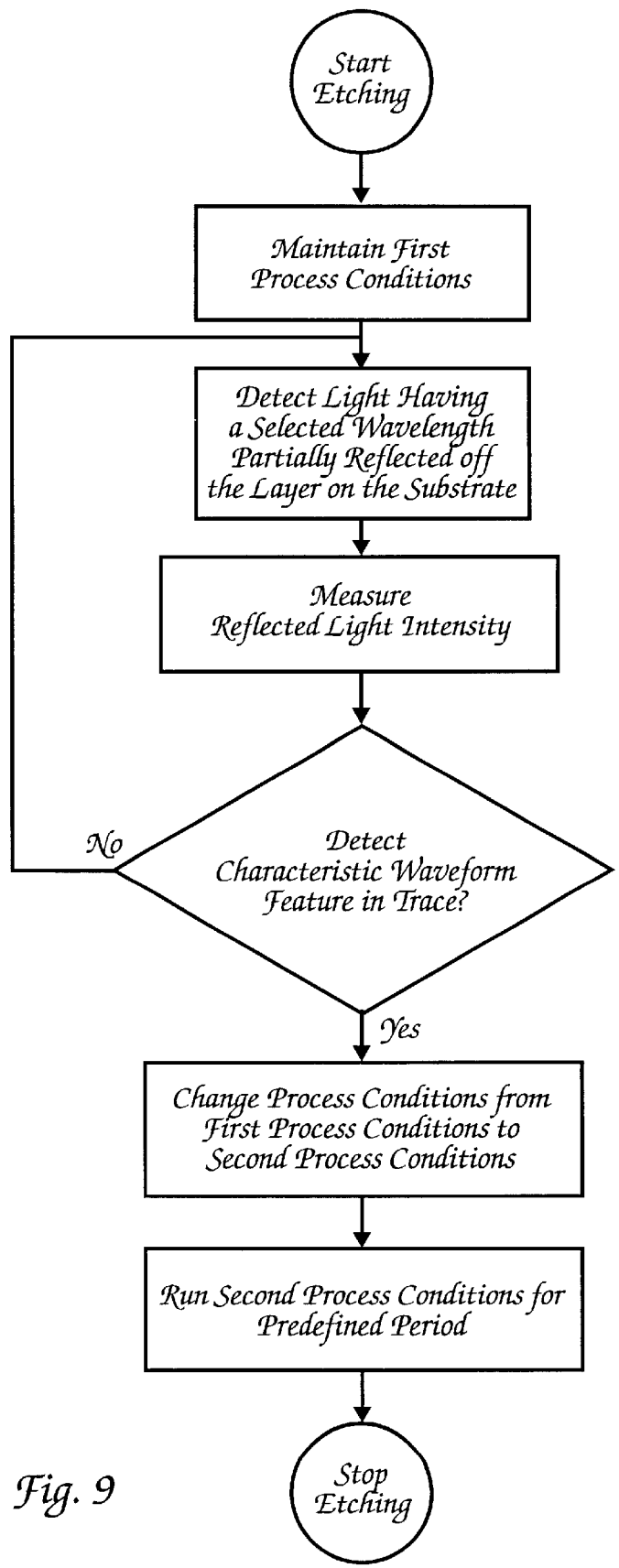
FIG. 9 is a flowchart of a process for processing a layer on a substrate and changing process conditions upon detecting an endpoint of the process.

Upon detecting the endpoint of the process, the endpoint detection software 126 on the computer system provides an endpoint signal to the process control software 124 which sends instructions to a process controller 128 to change a process condition in a chamber 28 in which the substrate 20 is being processed. The process controller 128 is adapted to control one or more of the gas delivery system 34, plasma generator 46, or throttle valve 44, to change a process condition in the chamber 28 in relation to an endpoint signal. FIG. 9 is a flowchart showing the typical process steps for processing a layer 30 on the substrate 20 and changing process conditions upon detecting an endpoint of the process. In these steps, first process conditions are maintained to process the layer, radiation such as a light beam is focused onto the substrate, and a trace of the reflected intensity of the light beam is measured. When the characteristic feature is detected in the trace of the reflected intensity, the first process conditions are changed to second process conditions, for example, and without limitations, to alter a rate of etching or deposition of the layer 22 on the substrate 20, to change an etching selectivity ratio, or to add a cleaning gas in a volumetric flow ratio sufficiently high to clean a surface in the process zone of the chamber 28 enclosing the substrate 20.

Figure 10:
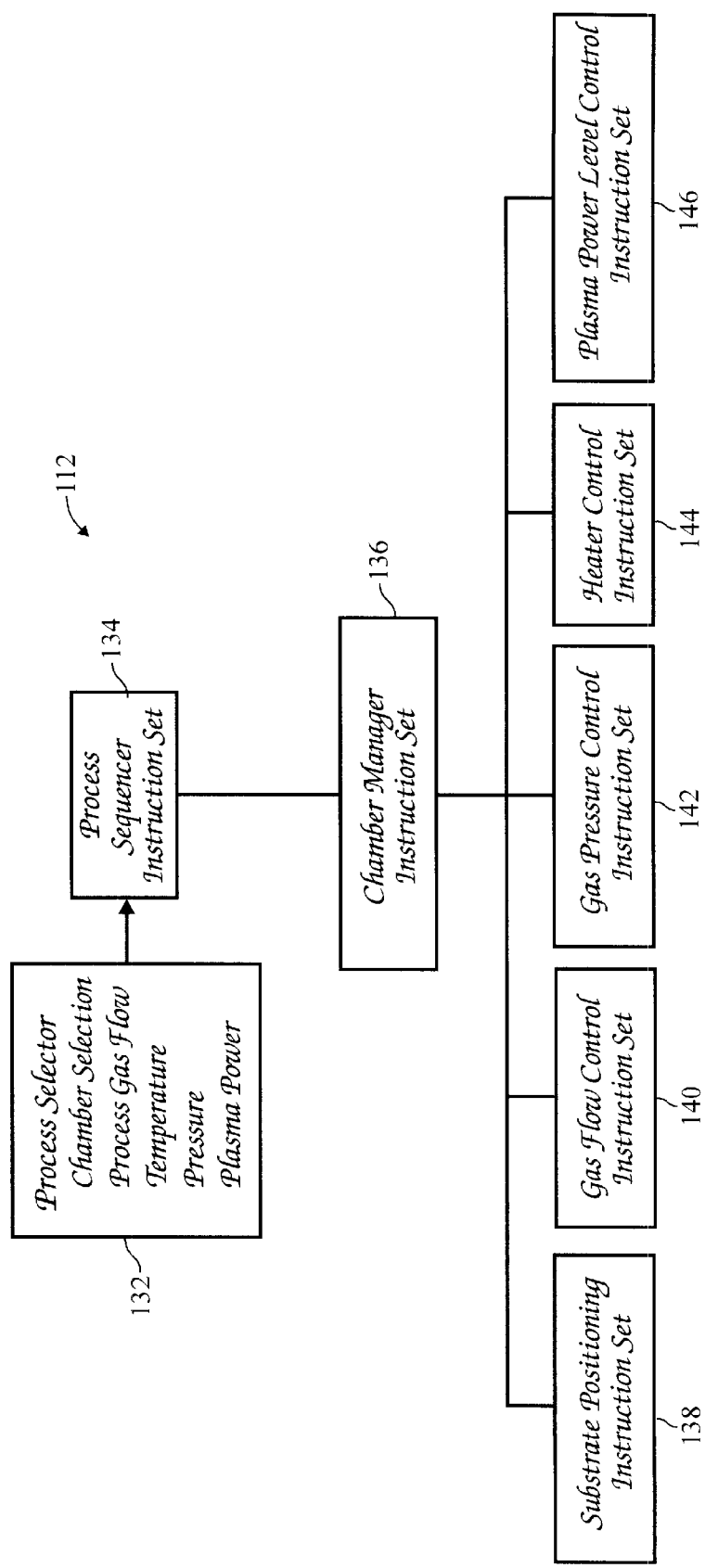
FIG. 10 is an illustrative block diagram of the hierarchical control structure of a process control software of a computer-readable program.

The processes for etching the layer 22 on the substrate 20 and optionally cleaning the chamber 28 are implemented by the process control software 124 and is executed by the process controller 128. The process control software 124 includes sets of instructions that dictate the timing, gas compositions, gas flow rates, chamber pressure, chamber temperature, RF power levels, support position, heater temperature, and other parameters of a particular process. FIG. 10 is an illustrative block diagram of the hierarchical control structure of the process control software 124, according to a specific embodiment. Using a light pen interface, a user enters a process set number and process chamber number into a process selector instruction set 132 in response to menus or screens displayed on the CRT terminal. The process sets are predetermined groups of process parameters necessary to carry out specified processes, and which are identified by predefined set numbers. Process selector instruction set 132 identifies (i) a desired process chamber 28, and (ii) the desired set of process parameters needed to operate the process chamber for performing the desired process. The process parameters for performing a specific process relate to process conditions, without limitations, such as for example, gas composition, gas flow rates, temperature, pressure, plasma conditions such as RF power levels (and in addition, microwave generator power levels for embodiments equipped with remote microwave plasma systems), cooling gas pressure and chamber wall temperature. Process selector instruction set 132 controls what type of process (etching, deposition, wafer cleaning, chamber cleaning, chamber gettering, reflowing) is performed at a certain time in chamber. In some embodiments, there may be more than one process selector instruction set 132. The process parameters are provided to the user in the form of a recipe and may be entered utilizing the light pen and monitor interface.

A process sequencer instruction set 134 comprises program code for accepting the identified process chamber 28 and set of process parameters from the process selector instruction set 132, and for controlling operation of the various process chambers. Multiple users can enter process set numbers and process chamber numbers or a single user can enter multiple process set numbers and process chamber numbers, so the sequencer instruction set 134 operates to schedule the selected processes in the desired sequence. Preferably the sequencer instruction set 134 includes program code to perform the steps of (i) monitoring the operation of the process chambers 28 to determine if the chambers are being used, (ii) determining what processes are being carried out in the chambers being used, and (iii) executing the desired process based on availability of a process chamber 28 and the type of process to be carried out. Conventional methods of monitoring the process chambers 28 can be used, such as polling. When scheduling which process is to be executed, sequencer instruction set 134 can be designed to take into consideration the present condition of the process chamber 28 being used in comparison with the desired process conditions for a selected process, or the "age" of each particular user-entered request, or any other relevant factor a system programmer desires to include for determining scheduling priorities.

Once the sequencer instruction set 134 determines which process chamber 28 and process set combination is going to be executed next, the sequencer instruction set 134 initiates execution of the process set by passing the particular process set parameters to a chamber manager instruction set 136 that controls multiple processing tasks in a process chamber 28 according to the process set determined by the sequencer instruction set 134. For example, the chamber manager instruction set 136 comprises program code for controlling etch or deposition operations in the process chamber 28. Chamber manager instruction set 136 also controls execution of various chamber component instruction sets that control operation of the chamber components necessary to carry out the selected process set. Examples of chamber component instruction sets are substrate positioning instruction set, gas flow control instruction set 140, gas pressure control instruction set 142, optional heater control instruction set 144 for chambers equipped with a heater in the support, and plasma control instruction set 146. Depending on the specific configuration of the chamber 28, some embodiments include all of the above instruction sets or instruction set, while other embodiments may include only some of the instruction sets. Those having ordinary skill in the art would readily recognize that other chamber control instruction sets can be included depending on what processes are to be performed in the process chamber 28.

In operation, the chamber manager instruction set 136 selectively schedules or calls the process component instruction sets in accordance with the particular process set being executed. The chamber manager instruction set 136 schedules the process component instruction sets much like the sequencer instruction set schedules which process chamber 28 and process set are to be executed next. Typically, chamber manager instruction set 136 includes steps of monitoring the various chamber components, determining which components need to be operated based on the process parameters for the process set to be executed, and initiating execution of a chamber component instruction set responsive to the monitoring and determining steps.

Operation of chamber component instruction sets will now be described. The substrate positioning instruction set 138 comprises program code for controlling chamber components that are used to load the substrate 20 onto the support 32 and optionally, to lift the substrate 20 to a desired height in the chamber 28 to control the spacing between The substrate 20 and the gas outlets 38 of the gas delivery system 34.

The process gas control instruction set 140 has program code for controlling the flow rates of different constituents of the process gas. The process gas control instruction set 140 controls the open/close position of the safety shut-off valves, and also ramps up/down the mass flow controllers to obtain the desired gas flow rate. The process gas control instruction set 140 is invoked by the chamber manager instruction set 136, as are all chamber component instruction sets, and receives process parameters related to the desired gas flow rates from the chamber manager 136. Typically, the process gas control instruction set 140 operates by opening the gas supply, and repeatedly (i) reading the necessary mass flow controllers, (ii) comparing the readings to the desired flow rates received from the chamber manager instruction set 136, and (iii) adjusting the flow rates of the gas supply lines as necessary. Furthermore, process gas control instruction set 140 includes steps for monitoring the gas flow rates for unsafe rates and activating the safety shut-off valves when an unsafe condition is detected. Process gas control instruction set 140 also controls the gas composition and flow rates for clean gases as well as for etching of deposition gases, depending on the desired process (etching, clean or deposition or other) that is selected. Alternative embodiments could have more than one process gas control instruction set 140, each instruction set controlling a specific type of process or specific set of gas flow controllers.

In some processes, an inert gas such as nitrogen or argon is flowed into chamber 28 to stabilize the pressure in the chamber before reactive process gases are introduced. For these processes, the process gas control instruction set 140 is programmed to include steps for flowing the inert gas into chamber 28 for an amount of time necessary to stabilize the pressure in the chamber, and then the steps described above would be carried out. Additionally, when a process gas is to be vaporized from a liquid precursor, for example in the deposition of TEOS-derived glass, process gas control instruction set 140 is written to include steps for bubbling a delivery gas, such as helium, through the liquid precursor in a bubbler assembly, or for introducing a carrier gas, such as helium, to a liquid injection system. When a bubbler is used for this type of process, the process gas control instruction set 140 regulates the flow of the delivery gas, the pressure in the bubbler, and the bubbler temperature in order to obtain the desired process gas flow rates. As discussed above, the desired process gas flow rates are transferred to the process gas control instruction set 140 as process parameters. Furthermore, the process gas control instruction set 140 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure, and bubbler temperature are monitored, compared with the necessary values, and adjusted accordingly.

The pressure control instruction set 142 comprises program code for controlling the pressure in the chamber 28 by regulating the aperture size of the throttle valve 44 in the exhaust system 42 of the chamber. The aperture size of the throttle valve 44 is set to control the chamber pressure at a desired level in relation to the total process gas flow, the size of the chamber 28, and the pumping set-point pressure for the exhaust system 42. When the pressure control instruction set 142 is invoked, the desired or target pressure level is received as a parameter from the chamber manager instruction set 136. The pressure control instruction set 142 measures the pressure in the chamber 28 by reading one or more conventional pressure manometers connected to the chamber 28, compares the measure value(s) with the target pressure, obtains PID (proportional, integral, and differential) values corresponding to the target pressure from a stored pressure table, and adjusts the throttle valve 44 according to the PID values obtained from the pressure table. Alternatively, the pressure control instruction set 142 can be written to open or close the throttle valve 44 to a particular aperture size to regulate the pumping capacity in chamber 28 to the desired level.

Optionally, the heater control instruction set 144 comprises program code for controlling the temperature of an optional heater element (not shown) used to resistively heat the support 32 and substrate 20. The heater control instruction set 144 is also invoked by the chamber manager instruction set 136 and receives a target, set-point, or temperature parameter. The heater control instruction set 144 measures the temperature by measuring voltage output of a thermocouple located in the support, comparing the measured temperature with the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat support, the heater control instruction set 144 gradually controls a ramp up/down of current applied to the loop. Additionally, a built-in, fail-safe mode can be included to detect process safety compliance and to shut down operation of the heating unit if the process chamber 28 is not properly set up.

The plasma control instruction set 146 comprises program code for setting low and high-frequency RF power levels applied to the process electrodes 50, 52 in the chamber 28. Like the previously described chamber component instruction sets, the plasma control instruction set 146 is invoked by the chamber manager instruction set 136. For embodiments including remote plasma generator 46, the plasma control instruction set 146 would also include program code for controlling a remote plasma generator (not shown).

Calculated Endpoint Absorption Trace

In another version of the present invention, the trace of the reflected radiation 64 is mathematically modeled or calculated and stored as a reference trace for algorithm determination. The trace is calculated ahead of time using an optical absorption model and knowing values for other parameters of the layer 22, e.g., its composition, refractive index, extinction coefficient, thickness, and other optical constants; the process etch rate and etching selectivity; and the amount of overlying resist area. In this version, the endpoint detection software 126 of the computer program 112 is programmed with code instructions to determine the net reflected amplitude of the radiation 64 or predict a change in the intensity of the reflected radiation that occurs as the layer 22 is completing processing.

Figure 11:
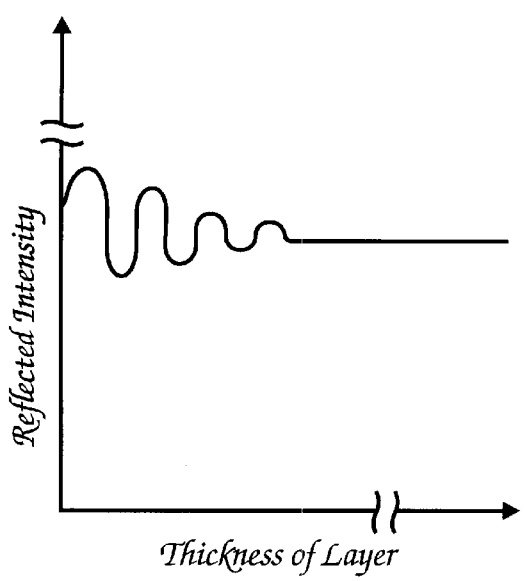
FIG. 11 is a graph of a mathematically modeled trace of the reflected intensity of radiation from a layer on the substrate for increasing thickness of the layer that occurs during a deposition process, such as CVD or PVD.

For example, FIG. 11 shows a mathematically modeled trace of the intensity of reflected radiation 64 from an absorbing layer 22 on a substrate 20 for increasing thicknesses of the layer 22. Such an increasing thickness of the layer 22 occurs during deposition of the layer 22 in processes such as, and without limitation, CVD, PVD and oxidation processes. In such deposition processes, the endpoint detection method is used to detect completion of a process of depositing the layer 22 on the substrate 20 when the thickness of the layer 22 reaches a predetermined thickness. In the deposition processes, instead of looking for the appearance of a characteristic feature or some other attribute in the trace of the intensity of the reflected radiation 64, it is the disappearance of a characteristic feature or attribute in the trace of the intensity of the reflected radiation 64 that is indicative of the approaching endpoint of the process. This sequence of events is simply a reverse sequence as that shown for example in FIGS. 1b and 1c. Initially, the radiation 60 that is incident upon the substrate 20 is reflected by the surfaces 106, 108 of the layer 22 being deposited on the substrate 20, because the layer 22 only has a thickness $d_3$ that is sufficiently small to be substantially non-absorbing or absorbing only to a small degree, as illustrated schematically in FIG. 1c. As the thickness of the layer 22 begins to grow during the deposition process, the incident radiation is continued to be partially reflected from the surface 106 of the layer 22 and partially reflected from the underlying interface 108, and the two reflected components 104, 109 constructively or destructively interfere due to their difference in pathlengths to provide a series of interference fringes as shown in FIG. 11. However, upon approaching the endpoint of the process, the thickness $d_2$ of the layer 22 being deposited now approaches a thickness level at which the component 100 of the incident radiation 60 is substantially absorbed in a predetermined pathlength 102 of the thickness of the deposited layer 22, which results in the disappearance of the interference fringes at this time. One or more of the disappearance effect, a predetermined time period before or after the disappearance of the fringes, or an appearance of a characteristic feature or attribute at a predetermined time period, is used to call the endpoint of the deposition process, As a rule of thumb, the thickness of the layer at which the interference fringes of the reflected radiation begin to appear or disappear is given by: d≡(0.37Å)/k, where k is the extinction coefficient of the layer 22 being deposited on the substrate 20. A modeled trace can be used to determine a suitable characteristic feature for endpoint detection, and as in the etching processes, the thickness and material properties of underlayers 24 also affect the shape and other properties of the trace of the reflected intensity.

For the processing of more complex systems comprising multiple layers having different compositions, such as a multicomponent polycide layer 22 comprising tungsten silicide deposited over polysilicon, the reflected trace will exhibit the same general behavior, but can be more precisely modeled by a matrix in which each component of the multicomponent layer 22 is represented by a 2×2 mathematical matrix that is used to calculate the total absorption/reflectivity of the layer 22. Thus, the computer program 112 can also comprise a set of instructions comprising program code to calculate a matrix comprising an array of values representing the total absorption or reflectivity obtained in each component of the layer 22 on the substrate 20. Lateral differences in the multicomponent layer 22 that arise from the features formed in the layer 22 can also be accounted for by summing the complex reflected amplitudes vectorially with phase from each multicomponent layer 22 to determine the total reflected intensity from the layer 22. Accordingly, the program code comprises a set of instructions to determine lateral differences in the multicomponent layer 22 arising from features formed in the layer 22 by summing the complex reflected amplitudes of all the components of the layer 22 to determine the total reflected intensity from the multicomponent layer 22. Alternatively, a recursive method can be used to model the trace of reflected radiation from such layers 22.

These equations and attributes are programmed into the endpoint detection software 126 of the computer program 112 to mathematically predict a change in intensity of the reflected radiation 64 as the layer is being processed, and to identify a suitable endpoint signal or characteristic feature that occurs during the process being performed on the substrate 20. In general, the endpoint detection software 126 of the computer program 112 comprises program code instructions for (i) modeling of a trace of the intensity of reflected radiation 64 as the substrate undergoes processing, (ii) optionally, selecting a characteristic feature from the modeled trace of the radiation (or a user can select the characteristic feature), (iii) storing the modeled trace and/or the characteristic feature, and (iv) detecting a portion of an incoming radiation signal from the radiation detector 62 and analyzing the measured signal relative to the attributes of the stored trace or characteristic feature, and when they are sufficiently alike in some attribute, calling an endpoint of the process being performed on the substrate 20.

Figure 12A:
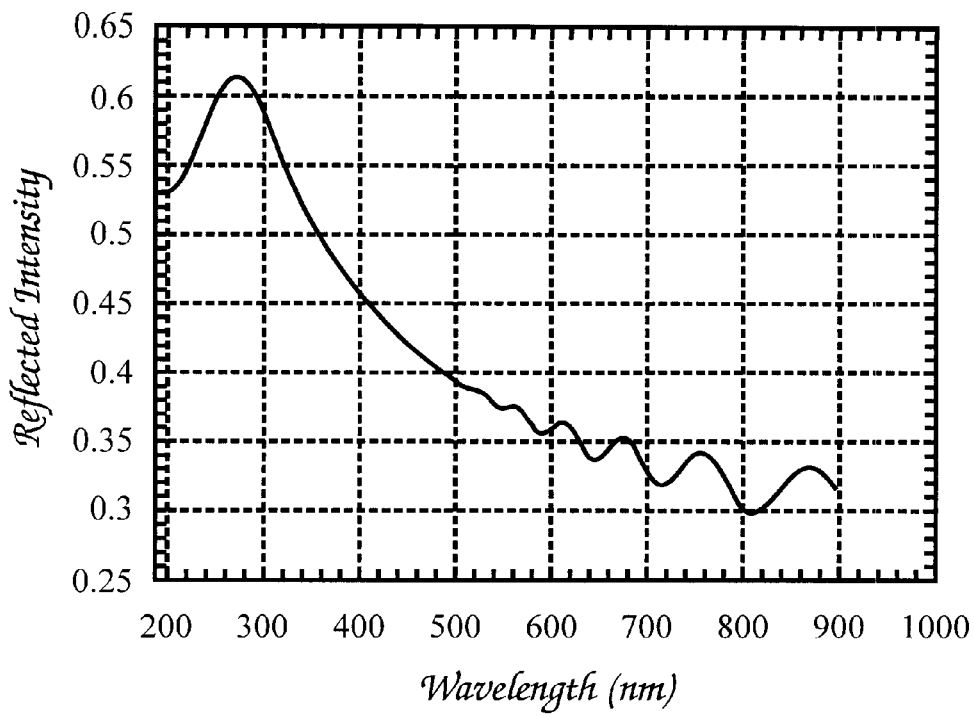
FIG. 12a is a graph showing a calculated trace of the intensity of radiation reflected from a substrate comprising a small grained polysilicon layer over a silicon dioxide layer on silicon, for increasing wavelengths of the radiation.
Figure 12B:
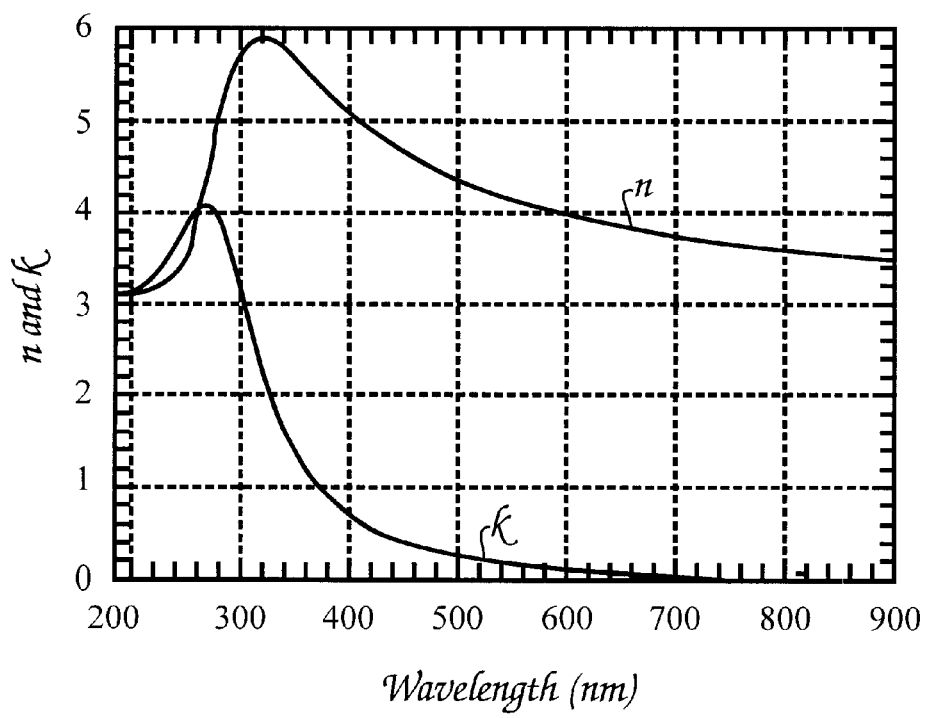
FIG. 12b is a graph of a trace of the experimentally determined values of n and k of the complex refractive index for the polysilicon layer on the substrate of FIG. 12a, for increasing wavelengths of the radiation.

For example, FIG. 12a is a calculated trace of the change in reflected intensity of radiation directed on a substrate 20 that comprises a small grained polysilicon layer 22 over a silicon dioxide layer 24 on silicon (not shown), for increasing wavelengths of radiation directed onto the substrate 20. The polysilicon layer 22 had a thickness of 6000 Å and the underlying silicon dioxide layer 165 a thickness of 35 Å. The curve is calculated to fit experimentally determined values of n (real part) and k (imaginary part) of the complex refractive index for increasing wavelengths of the reflected radiation, as shown in FIG. 12b. It should be noted that the extinction coefficient k becomes sufficiently large at low wavelengths to suppress optical interference from the back of the layer 22 and the underlayer 24. The point at which the interference fringes become small, for example at 1% of the total reflected intensity, is at a thickness of d≡(0.37λ)/k. Thus, the appearance or disappearance of a contribution to the total reflected intensity of radiation from below the surface of the layer 22 is clearly related to the wavelength and the extinction coefficient. Since k is a material parameter of the layer 24, a suitable wavelength of the radiation can be selected to yield a desired thickness at which the total change in intensity of the reflected radiation 64 becomes apparent in an etching or deposition process, and can be used to control the process. The onset of the interference fringes occurs at different thicknesses of the residual polysilicon layer 22 because the extinction coefficient k and hence the optical absorption varies for different wavelengths. For the example shown, a wavelength can be chosen to provide—in the case of etching a substrate 20—an onset of an interference fringe or other recognizable feature that occurs at any remaining thickness of the etched polysilicon layer 22.

Figure 13:
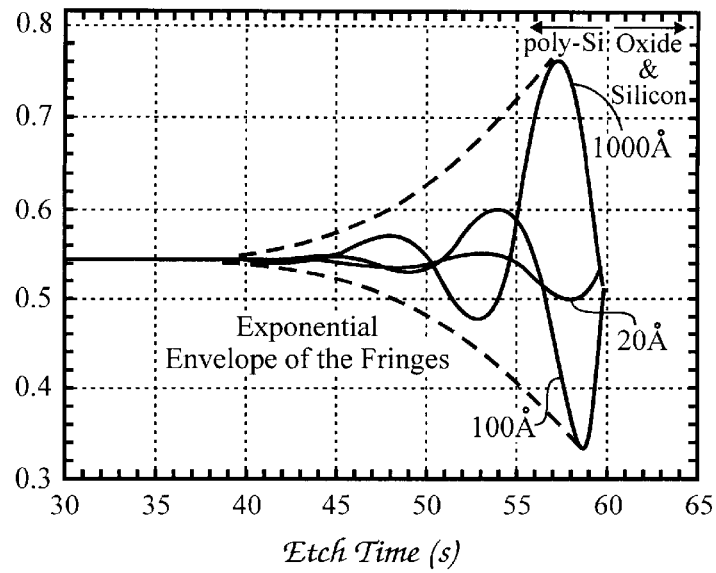
FIG. 13 is a graph showing a calculated trace of the intensity of radiation having a preselected wavelength that is at least partially reflected from a substrate comprising a polysilicon layer and different thicknesses of an underlying silicon dioxide layer on silicon.

In another example. FIG. 13 is a calculated trace of the change in intensity of reflected radiation 64 from a substrate 20 comprising a polysilicon layer 22 having an initial thickness of 2000 Å over an underlying silicon dioxide layer 24 having thicknesses of 20, 100, and 1000 Å, respectively, as a function of etch processing time. In the simulation, the etch rate of the polysilicon layer 22 was set at 2000 Å/min. Note that the onset of the interference fringes is not only dependent upon the thickness of the residual polysilicon layer 22 but also dependent upon the thickness of the underlying layer 22. Thus, while all the curves reach the same etching point at the same time, for example, reach the interface between the layer 24 and the layer 22 at about 60 seconds, each curve has a different onset time for the appearance of an interference fringe, as well as different shapes of interference fringes. This example demonstrates the desirability of empirically or mathematically determining a trace of the reflected intensity for a particular substrate 20, and thereafter select a suitable characteristic feature or change in the trace of the reflected intensity to determine the process endpoint.

In yet another example, FIG. 14a is a calculated trace of the intensity of radiation having a preselected wavelength of 2537 angstroms, that is at least partially reflected from a substrate 20 comprising an aluminum layer 22 having a thickness of 1000 Å that is etched at an etch rate of 1000 Å/min, and that lies over an oxide layer 24 on silicon (not shown). The trace is calculated as the substrate is being etched and for two different thicknesses of underlying oxide layer 24 of 30 Å (thinner layer) and 1 micron (thicker layer). Note that at an 80% level of the reflected intensity—arbitrarily selected as a signal change that could be indicative of an endpoint of the process—the thickness of the residual unetched aluminum layer 22 is about 170 Å on the substrate 20 having the thicker oxide layer 24 and only about 55 Å on the substrate 20 having the thinner oxide layer 24. The 80% level could be used as a predetermined quantitative level of change in intensity of the reflected radiation 64 for detecting the endpoint of the process, however, it is necessary to determine the trace of the reflected radiation 64 for the particular features or characteristics of the substrate 20 being processed, otherwise, the endpoint would be called for an erroneous residual thickness of etched material. In yet another example, FIG. 14b shows a calculated trace of the change in intensity of radiation having a preselected wavelength of 3650 angstroms, that is at least partially reflected from the same substrate 20. Again, it is seen that at the 80% level of the reflected intensity, the thickness of the residual unetched aluminum layer 22 is about 150 Å on the substrate 20 having the thicker oxide layer 24 and about 65 Å on the substrate 20 having the thinner oxide layer 24, indicative of the effect of the properties of the underlying layer 24.

The endpoint detection method of the present invention significantly improved substrate yields and was especially useful in the etching of polysilicon layers overlying thin gate oxide underlayers having thicknesses as low as 25 to 65 Å—more than 4 times thinner than prior art gate oxide layers. By stopping the etching process before the thin gate oxide layer is etched through or otherwise damaged, the endpoint method provided higher yields of integrated circuits from a substrate.

EXAMPLE 1
Cleaning and Etching Process

In this example, the chamber 28 used for deposition or etching is cleaned to remove residue deposits and contaminants that are deposited on walls, components, and other surfaces in the chamber; otherwise, the deposits can flake off and contaminate the substrate 20. In conventional etching processes, the chamber 28 is opened to the atmosphere after etching of 100 to 300 wafers and cleaned in a "wet-cleaning" process, in which an operator uses an acid or solvent to scrub-off accumulated etch residue. After cleaning, the chamber 28 is pumped down for 2 to 3 hours to outgas volatile species, and thereafter, a number of etching runs are performed on dummy wafers until consistent etching results are obtained. The downtime of the etching chamber 28 during the wet cleaning process substantially increases the cost per substrate 20 and capitalization costs. Also, because the wet cleaning process is performed manually, the cleanliness of the chamber surfaces often varies from one cleaning session to another. Thus it is desirable to reduce or eliminate the deposits formed on chamber surfaces during processing of a substrate 20 to reduce use or eliminate wet cleaning steps.

Thus, another aspect of the present invention, comprises a cleaning process performed along with the etching process. In a preferred version, a first layer 22 on a substrate 20 is etched in a first stage of the etching process, by a process gas comprising a composition of etchant gas that provides a high etching rate and a chamber cleaning gas that cleans the etchant residue formed on the walls of the chamber 28. An etching endpoint is detected immediately prior to etching through the first layer 22, and the composition of the process gas is changed in a second stage of the process to remove the cleaning gas to etch the remaining portion of the first layer without damaging the underlying second layer 22. The cleaning gas in the first stage of the process cleans the etching chamber 28 without requiring stopping etching in between processing of batches of substrates 20 to perform wet cleaning processes.

Instead of in the first stage, the cleaning gas can also be added to the process gas in any etching stage that is used to etch through a particular layer 22 on the substrate 20. For example, multiple stage etching processes can be used to etch stacked layers of different materials on the substrate 20. In such processes, the cleaning gas is introduced in at least one of the stages to remove the etchant residue deposited on the chamber surfaces during all of the preceding or succeeding stages. The multiple stage process is useful for etching polycide structures that comprise multiple layers 22 of tungsten silicide and polysilicon layers or for etching silicon nitride layers or silicon dioxide layers on silicon wafers. Although the multiple stage process is illustrated in The context of etching such layers, it should be understood that the process can be used to etch other layers such as metal layers. Thus, the present process should not be limited to the examples and illustrative methods provided herein.

In the cleaning stage, cleaning gas is added to the etchant gas so that the etchant residue formed on chamber surfaces during etching is substantially entirely removed by the end of the etching process. In a preferred embodiment, the etchant gas comprises one or more of $Cl_2$, $N_2$, $O_2$, HBr, or He—$O_2$; and the cleaning gas comprises inorganic nonhydrocarbon-containing fluorinated gas such as one or more of $NF_3$, $CF_4$, or $SF_6$. Preferably, the volumetric flow ratio of cleaning gas to etchant gas is selected to remove substantially the entire etchant residue from the chamber surfaces upon completion of the etching process. More preferably, the volumetric flow ratio of cleaning gas to etchant gas is selected to remove substantially all the etchant residue formed during processing of at least 2000 substrates 20 in the chamber 28, without performing a separate cleaning step for cleaning the chamber. A suitable volumetric flow ratio of cleaning gas to etchant gas is from about 1:20 to about 1:1, and more preferably from about 1:10 to about 2:3, and most preferably about 2:3. It has been discovered that at these volumetric flow ratios substantially all the etchant residue on the chamber surfaces are removed without eroding the chamber surfaces. In addition, it has been unexpectedly discovered that the chamber surfaces are cleaned and conditioned by the etchant and cleaning gas combination step, without requiring a separate chamber 28 conditioning or seasoning step.

In the etching of silicon-containing layers 22, the addition of fluorinated cleaning gas to the etchant gas composition, makes the resultant process gas highly reactive to the silicon-containing layers and provides a high etch rate and a low etching selectivity ratio for etching an overlying polysilicon layer relative to an underlaying silicon dioxide layer. Typically, the addition of cleaning gas drops the etching selectivity ratio down to 4:1 to 6:1. In contrast, the etching selectivity ratio obtained with conventional etchant gas compositions is from 10:1 to 12:1. This causes the cleaning gas plasma to etch or damage the underlayer 24 when the underlayer is exposed to the plasma. This is even more of a problem when the underlayer 24 is very thin, on the order of a few layers of atoms, and is very quickly damaged or etched through.

In the etching process, the substrate 20 is first etched by a first process gas comprising a mixture of etchant gas and cleaning gas. The etchant gas comprises 120 sccm HBr, 30 sccm $Cl_2$, and 10 sccm He—$O_2$ (containing 30% $O_2$). The cleaning gas composition comprises $CF_4$ added to the etchant gas in a volumetric flow rate of about 25% of the total flow rate of cleaning gas, which is about 40 sccm. The source power level of the inductor antenna is maintained at about 500 watts and the RF bias power level of the process electrodes at about 100 W. The gas pressure is about 4 mTorr and the temperature of the support at about 50° C. The cleaning gas throughly cleaned all the etchant residue deposits off the chamber walls during the etching process so that a separate wet cleaning step was not needed. However, it was determined that the addition of $CF_4$ gas reduced the etching selectivity ratio for etching polysilicon relative to the underlying silicon dioxide to an etching selectivity ratio of about 5:1. The relatively low etching selectivity ratio would result in rapid deterioration of the underlayer 24 if the etching process was not changed prior to completion of etching of the underlayer.

During the first stage of the etching process, the endpoint detection system 56 was programmed to detect an endpoint for etching the layer 22 on the substrate 20, when etching had proceeded to near completion, i.e., with about 30 nm of polysilicon layer remaining on the substrate. When the selected characteristic waveform feature was detected by the computer system, the first process conditions were changed to second process conditions to reduce the etching rate and increase or maximize the etching selectivity ratio for etching the polysilicon layer 22 relative to the underlying silicon dioxide layer. The second process conditions used a second process gas comprising 120 sccm HBr and 10 sccm He—$O_2$ (without any $Cl_2$ or $CF_4$ added to the process gas) to etch the remaining 300 Å portion of the polysilicon layer 22. The pressure in the chamber 28 was maintained at a much higher pressure of 55 mTorr, the inductor source power level at 900 watts, and the RF bias power level at 70 watts, to provide a higher source to bias power ratio of about 12. The second process gas composition, being absent $CF_4$ cleaning gas, provided an etching selectivity ratio for etching polysilicon relative to the underlying silicon dioxide of about 12:1, which is more than two times higher than the etching selectivity ratio obtained from the first process gas comprising both cleaning and etchant gas. This significantly reduced damage of the underlayer 24 on the substrate 20.

EXAMPLE 2

In another example, a substrate 20 comprising polycrystalline silicon is etched in the first stage using a plasma of a first process gas comprising $Cl_2$, $N_2$, and $CF_4$, and optionally $O_2$. Preferably, the volumetric flow ratio of $Cl_2$, $N_2$, and $CF_4$ is selected To remove substantially all the etchant residue generated by etching at least 2000 substrates 20 in the chamber 28, without performing a separate cleaning step for cleaning the chamber. The ratio of the volumetric flow ratio of $CF_4:(Cl_2+N_2)$ is more preferably from about 1:20 to about 1:1. Thereafter, in the second stage of the process. the flow of cleaning gas is terminated, and the substrate 20 is processed with an etchant gas that is absent cleaning gas. The $CF_4$ gas can also be substituted with $SF_6$ or $NF_3$.

EXAMPLE 3

A multistage process can also be used to etch different layers 22 on the substrate 20, and the cleaning gas is introduced in at least one of the stages to remove the etchant residue deposited on the chamber surfaces. The substrate comprises a multilayer polycide structure comprising tungsten silicide over polysilicon. The tungsten silicide layer 22 is etched using a first process gas comprising chlorine-containing gases, for example, a mixture of chlorine and nitrogen, and optionally oxygen. Preferably, the volumetric flow ratio of chlorine to nitrogen is about 1:3 to about 1:1, and more preferably about 2:3. The pressure in the chamber 28 is maintained at 1 to 10 mTorr, the inductor coil source power level at 200 to 800 Watts, and the RF bias power level of the process electrodes at 20 to 120 Watts.

In the second etching stage, a second process gas is introduced into the chamber 28 and a plasma is formed to etch a second layer 22, such as a polysilicon layer, below the tungsten silicide layer, after the tungsten silicide layer has been completely etched. The polysilicon layer 22 can be etched in more than one etching process step, with the etchant gas composition being changed during each etching step. Suitable second process gas compositions comprise $Cl_2$ in a flow rate of from 20 to 120 sccm, HBr at about 80 to 240 sccm, and He—$O_2$ at about 2 to 10 sccm. The chamber pressure is from about 25 to 200 mTorr. The power level of the source current applied to the inductor antenna 48 is from about 200 to 800 Watts, and the bias RF power level of the voltage applied to the process electrodes 50, 52 is from about 20 to 120 Watts.

In one or more of the first and second stages, a cleaning gas is added to the etchant gas in a volumetric ratio selected so that the etchant residue formed in any one of the stages is substantially entirely removed during the etching process. The etchant residue formed in the first and second stages typically comprises polymeric organic compounds containing halogen, carbon, hydrogen, and oxygen. When silicon-containing layers 22 are being etched, the etchant residue comprises predominantly silicon dioxide compounds formed during etching of both the tungsten silicide and polysilicon layers on the substrate 20. However, the composition of etchant residue can vary from the first to the second layer 22, the first etchant residue composed more of W and Si species and the second etchant residue composed more of Si and O species. Thus the cleaning gas is added to the process gas in the first or second stage, in a volumetric ratio suitable for removing the first etchant residue formed in the first etching stage in which the tungsten silicide layer 22 is etched, as well as the second etchant residue formed during the second etching stage in which the polysilicon layer is etched. A suitable volumetric flow ratio of cleaning gas to etchant gas is from about 1:10 to about 2:3. For example, to a flow rate of first etchant gas of about 80 sccm $Cl_2$ and 40 sccm $N_2$, a cleaning gas comprising $CF_4$ at a flow rate of 80 sccm was added to provide a volumetric ratio of cleaning gas to first etchant gas of about 2:3.

The cleaning process removes substantially all the etchant residue formed during processing of over 2000 substrates 20. In one experiment, over 3000 substrates 20 of silicon wafers having an underlayer 24 of 1000 Å of $SiO_2$, covered by a polycide layer 22 comprising 3000 Å of polysilicon and 3000 Å of $WSi_x$, were sequentially etched in the etching chamber 28, and the properties of the etched features, etching rates, and etching selectivity ratios measured for selected wafers. The tungsten silicide layer 22 was etched using a first process gas comprising etchant gas of 80 sccm $Cl_2$ and 40 sccm $N_2$, and cleaning gas of 80 sccm $CF_4$, which provides a volumetric flow ratio of cleaning gas to etchant gas of about 2:3. The pressure in the chamber 28 was maintained at 4 mTorr, the source power level was set at 600 Watts and the R.F. bias power level at 60 watts.

The etching and cleaning process was found to uniformly etch substrates 20 while simultaneously removing etchant residues deposited on the chamber 28 during the etching process, irrespective of the thickness or chemical stoichiometry of The etchant residue layers 22. Prior art etching processes required cleaning and conditioning of the chamber 28 after processing of only 200 to 300 wafers, because of the variation in etching rates and etching selectivity ratio and the higher particle contamination levels that resulted from etchant residue deposits on the chamber surfaces, after processing this number of wafers. Also, prior art cleaning processes, particularly those performed by an operator, often fail to uniformly clean and remove the etchant residue deposits formed on chamber surfaces, and such build-up of etchant deposits resulted in flaking off and contamination of the substrate 20.

In contrast, the process of the present invention removes etchant residues formed across substantially all of the chamber surfaces to reduce contamination and increase substrate yields. The cleaning gas also results in much less erosive damage to the chamber 28 compared to conventional in-situ plasma cleaning steps because of the reduced energy levels of the plasma in the chamber. This was difficult to accomplish in prior art processes because the high powered plasmas used to remove the residue deposits also resulted in erosion damage of chamber surfaces and components. The cost of operating the chamber 28 and the cost per substrate 20 are significantly reduced by reducing the need to replace chamber components. Furthermore, the cleaning gas can be used to efficiently clean a chamber 28 in-situ during etching of substrates 20, rather than stopping of processing to wet clean the chamber walls and components, thereby increasing process throughput and further reducing costs per substrate. The etching and cleaning process is expected to increase chamber lifetimes by a factor of at least 2, and also increase substrate yields by reducing the deposition of flaked-off etchant byproducts onto the substrate 20.

The present invention is described with reference to certain preferred versions thereof, however, other versions are possible. For example, the endpoint detection process can be used for detecting endpoints in other processes and in other chambers as would be apparent to one of ordinary skill, including without limitation, sputtering chambers, ion implantation chambers and other deposition chambers. Therefore, the spirit and scope of the appended claims should not be limited to the description of the preferred versions contained herein.

What is claimed is:

1. A chamber for processing a substrate, the chamber comprising:
   (a) a radiation source capable of emitting radiation having a wavelength that is substantially absorbed in a pathlength in a thickness of a layer on the substrate; and
   (b) a radiation detector adapted to detect the radiation.

2. A chamber according to claim 1 wherein the radiation is at least partially reflected by one or more underlayers on the substrate, and the radiation detector detects a change in the intensity of the radiation.

3. A chamber according to claim 2 wherein the radiation is substantially absorbed in a first thickness of the layer, and is at least partially transmitted through a second thickness of the layer and reflected by the underlayers.

4. A chamber according to claim 1 wherein the layer has an extinction coefficient for the wavelength of the radiation that is sufficiently high for the radiation to be absorbed in a first thickness of the layer and sufficiently low for the radiation to be at least partially transmitted through a second thickness of the layer, the second thickness being smaller than the first thickness.

5. A chamber according to claim 1 wherein the radiation source is outside the chamber.

6. A chamber according to claim 1 wherein the radiation source comprises a lamp, light emitting diode or laser.

7. A chamber according to claim 1 wherein the radiation source comprises an emission from a plasma.

8. A chamber according to claim 1 wherein the radiation source provides radiation comprising nonpolarized light.

9. A chamber according to claim 1 further comprising a filter in a path of the radiation, the filter adapted to selectively pass through the radiation.

10. A chamber according to claim 1 further comprising a diffraction grating in a path of the radiation, the diffraction grating adapted to selectively pass through the radiation.

11. A chamber according to claim 1 further comprising a controller adapted to receive a signal from the radiation detector and analyze the signal to detect a characteristic feature that corresponds to an endpoint of a stage of the process.

12. A chamber according to claim 11 wherein the controller changes a process condition in the chamber upon detecting the characteristic feature, the process condition comprising one or more of gas composition, gas flow rate, an operating power level of a gas energizer, gas pressure and temperature.

13. A chamber for processing a substrate, the chamber comprising a radiation source capable of emitting radiation having a wavelength that is substantially absorbed in a pathlength of a thickness of a layer on the substrate, a radiation detector adapted to detect the radiation, and a filter in a path of the radiation, the filter adapted to selectively pass through the radiation.

14. A chamber according to claim 13 wherein the radiation is at least partially reflected by the substrate, and the radiation detector detects a change in the radiation.

15. A chamber according to claim 14 wherein the radiation is substantially absorbed in a first thickness of the layer, and is at least partially transmitted through a second thickness of the layer and reflected by one or more underlayers.

16. A chamber according to claim 13 wherein the filter comprises a radiation absorbing material.

17. A chamber according to claim 13 wherein the filter comprises a diffraction grating.

18. A chamber according to claim 13 further comprising a controller adapted to receive a signal from the radiation detector and analyze the signal to detect a characteristic feature corresponding to an endpoint of a stage of the process.

19. A chamber according to claim 18 wherein the controller changes a process condition in the chamber upon detecting the characteristic feature, the process condition comprising one or more of gas composition gas flow rate, an operating power level of a gas energizer, gas pressure and temperature.

20. A method of processing a substrate, the method comprising the steps of:
   (a) placing the substrate in a process zone;
   (b) maintaining process conditions in the process zone for processing a layer on the substrate, the process conditions comprising one or more of gas composition, gas flow rate, an operating power level of a gas energizer, gas pressure and temperature;
   (c) providing radiation having a wavelength that is absorbed in a pathlength of a thickness of the layer being processed on the substrate; and
   (d) detecting a change in the substrate reflected radiation after processing of the thickness of the layer.

21. A method according to claim 20 wherein the change in the radiation occurs from partial reflection of the radiation by one or more underlayers on the substrate.

22. A method according to claim 20 comprising the step of providing radiation that is substantially absorbed in a first thickness of the layer, and is at least partially transmitted through a second thickness of the layer and reflected by one or more underlayers.

23. A method according to claim 20 comprising the step of providing radiation having a wavelength for which an extinction coefficient of the layer is sufficiently high for the radiation to be substantially absorbed in a first thickness of the layer, and sufficiently low for the radiation to be at least partially transmitted through a second thickness of the layer, the second thickness being smaller than the first thickness.

24. A method according to claim 20 comprising the step of providing radiation comprising nonpolarized light.

25. A method according to claim 20 comprising the step of filtering the radiation to selectively pass through the radiation.

26. A method according to claim 20 further comprising the step of determining a stage of processing of the layer upon detecting the change in the radiation.

27. A method according to claim 26 further comprising the step of changing a process condition upon detecting the change in the radiation.

28. A method according to claim 27 comprising the step of changing a process condition for altering a rate of etching or deposition of the layer on the substrate.

29. A method according to claim 26 comprising the step of changing a process condition by adding a cleaning gas in a volumetric flow ratio sufficiently high to clean a surface in a chamber enclosing the substrate.

30. A method of etching a layer on a substrate, the method comprising the steps of:
    (a) placing the substrate in a process zone;
    (b) maintaining process conditions in the process zone for etching the layer on the substrate;
    (c) providing radiation having a wavelength that is substantially absorbed in a pathlength in a thickness of the layer being etched on the substrate; and
    (d) detecting a change in the substrate reflected radiation.

31. A method according to claim 30 comprising the step of providing radiation that is at least partially reflected by one or more underlayers on the substrate after partial etching of the layer.

32. A method according to claim 31 comprising the step of providing a radiation that is substantially absorbed in a first thickness of the layer, and is at least partially transmitted through a second thickness of the layer, the second thickness being smaller than the first thickness.

33. A method according to claim 31 further comprising the step of changing a process condition in the chamber upon detecting a change in the radiation, the process condition comprising one or more of gas composition, gas flow rate, an operating power level of a gas energizer, gas pressure and temperature.

34. A method according to claim 30 further comprising the step of determining a stage of etching of the layer upon detecting a change in the radiation.

35. A method according to claim 30 further comprising the step of changing a rate of etching of the layer upon detecting a change in the radiation.

36. A method of processing a substrate, the method comprising the steps of:
    (a) placing the substrate into a process zone;
    (b) maintaining process conditions in the process zone to process a layer on the substrate, the process conditions comprising one or more of gas composition, gas flow rate, an operating power level of gas energizer, gas pressure and temperature;
    (c) providing a radiation having a wavelength that is substantially absorbed in a pathlength in a first thickness of the layer being processed on the substrate, and that is at least partially transmitted through a second thickness of the layer and reflected by one or more underlayers, the second thickness being smaller than the first thickness; and
    (d) detecting a change in the radiation upon reflection of the radiation by the underlayers.

37. A method according to claim 36 wherein step (d) comprises the step of detecting the intensity of the radiation.

38. A method according to claim 37 wherein step (d) comprises the step of detecting a characteristic feature of a trace of the intensity of the radiation.

39. A method according to claim 38 comprising the step of comparing the characteristic feature to a reference feature, and when the two features are substantially similar, changing the process conditions in the chamber.

40. A method of processing a substrate, the method comprising the steps of:
    (a) placing the substrate in a process zone, and maintaining process conditions in the process zone to process a layer on the substrate;
    (b) providing light on the substrate, the light having a wavelength that is substantially absorbed in a pathlength in a thickness of the layer on the substrate; and
    (c) detecting a change in an intensity of the light that occurs upon at least partial reflection of the light by one or more underlayers on the substrate.

41. A method according to claim 40 wherein step (c) comprises the step of detecting a characteristic feature of the intensity of the light.

42. A method according to claim 40 comprising the step of radiating unpolarized light on the substrate.

43. A method of selecting a wavelength for determining an endpoint of a process being performed on a substrate, the method comprising the step of determining a wavelength of a radiation characterized in that when the radiation having the wavelength is incident on the substrate, upon approaching the endpoint of the process, there occurs a detectable change in intensity of the reflected radiation that arises from a transition between substantial absorption of the radiation by the layer being processed on the substrate to at least partial reflection by one or more underlayers on the substrate.

44. A method according to claim 43 comprising the step of computing the radiation having the wavelength.

45. A method according to claim 43 wherein the layer comprises a dielectric, semiconductor or metal.

46. An apparatus for detecting an endpoint of a process being performed on a substrate, the apparatus comprising:
    (a) a radiation source capable of emitting radiation having a wavelength that is substantially absorbed in a pathlength of a thickness of a layer on the substrate;
    (b) a radiation detector adapted to detect the radiation and generate a signal; and
    (c) a memory comprising a computer-readable medium having a computer-readable program embodied therein, the computer readable program including a set of instructions to detect a change in the signal to determine the endpoint of the process.

47. An apparatus according to claim 46 wherein the computer-readable program comprises a set of instructions to provide an endpoint signal to a controller to change a process condition of the process being conducted on the substrate.

48. An apparatus according to claim 46 wherein the computer-readable program comprises a set of instructions to detect a change in intensity or a rate of change of an intensity of the signal.

49. An apparatus according to claim 46 wherein the computer-readable program comprises a set of instructions to detect a characteristic feature of the signal.

50. An apparatus according to claim 49 wherein the computer-readable program comprises a set of instructions to model a trace of the signal for an operator to select a suitable characteristic feature.

51. A substrate processing apparatus comprising:
    (a) a chamber comprising a support adapted to support a substrate in the chamber, a gas delivery system adapted to introduce gas into the chamber, a plasma generator adapted to energize the gas in the chamber, an exhaust comprising a throttle valve adapted to control the pressure of gas in the chamber, and a controller adapted to control one or more of the gas delivery system, plasma generator or throttle valve, to change a process condition in the chamber in relation to an endpoint signal; and (b) an endpoint detection system comprising a radiation source capable of emitting radiation having a wavelength that is substantially absorbed in a pathlength in a thickness of the layer, a radiation detector adapted to detect the radiation and generate a signal, and a memory coupled to the controller of the chamber, the memory comprising a computer-readable medium having a computer-readable program embodied therein for directing operation of the substrate processing apparatus, the computer-readable program including a set of instructions to detect a change in the signal to determine an endpoint of the process and provide an endpoint signal to the controller.

52. A substrate processing apparatus according to claim 51 wherein the computer-readable program comprises a set of instructions to detect a change in intensity or a rate of change of an intensity in the signal.

53. A substrate processing apparatus according to claim 52 wherein the computer-readable program comprises a set of instructions to detect a characteristic feature of the signal.

54. A substrate processing apparatus according to claim 51 wherein the computer-readable program comprises a set of instructions to model the signal for an operator to select a suitable characteristic feature.

55. A method of etching a layer on a substrate in a chamber, the method comprising the steps of:

(a) placing the substrate in the chamber;

(b) providing in the chamber, a process gas comprising etchant gas and cleaning gas, and maintaining process conditions to etch the layer on the substrate and simultaneously clean a surface of the chamber; and (c) prior to etching through the layer, changing the composition of the process gas to remove the cleaning gas.

56. A method according to claim 55 wherein the etchant gas comprises one or more of $Cl_2$, $HBr$, $N_2$, $O_2$, or $He-O_2$.

57. A method according to claim 55 wherein the cleaning gas comprises one or more of $NF_3$, $CF_4$, or $SF_6$.

58. A method according to claim 55 wherein the volumetric flow ratio of cleaning gas to etchant gas is from about 1:20 to about 1:1.

59. A substrate etching method comprising:

(a) placing a substrate in a process zone, the substrate comprising a layer;

(b) maintaining process conditions in the process zone for etching the layer on the substrate, the process conditions comprising at least one of gas composition, gas flow rate, an operating power level of a gas energizer, gas pressure and temperature;

(c) providing radiation that is incident on the substrate, the radiation having a wavelength that is substantially absorbed in a pathlength in the layer on the substrate; and (d) determining an endpoint of the etching process by detecting a change in the intensity of the radiation reflected from the substrate that arises from the onset of an interference fringe.

60. A method according to claim 59 wherein the onset of the interference fringe occurs after an intensity trace of the reflected radiation that is substantially absent periodic maxima and minima.

61. A method according to claim 59 wherein the onset of the interference fringe occurs after an intensity trace of the reflected radiation comprising a substantially constant intensity level.

62. A method according to claim 59 wherein the change in intensity of the reflected radiation arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

63. A method according to claim 59 wherein the layer comprises a thickness of less than about 50 angstroms.

64. A method according to claim 59 wherein the layer comprises a gate oxide or polysilicon layer.

65. A substrate etching method comprising:

(a) placing a substrate in a process zone, the substrate comprising a layer composed of gate oxide or polysilicon, the layer comprising a thickness of less than about 50 angstroms;

(b) maintaining process conditions in the process zone for etching the layer on the substrate, the process conditions comprising at least one of gas composition, gas flow rate, an operating power level of a gas energizer, gas pressure and temperature;

(c) providing radiation that is incident on the substrate, the radiation having a wavelength that is substantially absorbed in a pathlength in the layer on the substrate; and (d) determining an endpoint of the etching process by detecting a change in the intensity of the radiation reflected from the substrate that arises from an onset of an interference fringe that occurs after an intensity trace of the reflected radiation that is substantially absent periodic maxima and minima.

66. A method according to claim 65 wherein the onset of the interference fringe occurs after an intensity trace comprising a substantially constant intensity level.

67. A method according to claim 65 wherein the change in intensity of the reflected radiation arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

68. A substrate etching method comprising:

(a) placing a substrate in a process zone, the substrate comprising a layer;

(b) maintaining process conditions in the process zone for etching the layer on the substrate, the process conditions comprising at least one of gas composition, gas flow rate, an operating power level of a gas energizer, gas pressure and temperature;

(c) providing radiation that is incident on the substrate; and (d) determining an endpoint of the etching process by detecting a change in the intensity of the radiation reflected from the substrate that arises from an onset of an interference fringe after an intensity trace of the reflected radiation that is substantially absent periodic maxima and minima.

69. A method according to claim 68 wherein the radiation has a wavelength that is capable of being substantially absorbed in a pathlength in the layer on the substrate.

70. A method according to claim 69 wherein the change in intensity of the reflected radiation arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

71. A method according to claim 68 wherein the intensity trace comprises a substantially constant intensity level.

72. A method according to claim 68 wherein the layer comprises a thickness of less than about 50 angstroms.

73. A method according to claim 68 wherein the layer comprises a gate oxide or polysilicon layer.

74. A substrate etching method comprising:
(a) placing a substrate in a process zone, the substrate comprising a layer;
(b) maintaining process conditions in the process zone for etching the layer on the substrate, the process conditions comprising at least one of gas composition, gas flow rate, an operating power level of a gas energizer, gas pressure and temperature;
(c) providing radiation that is incident on the substrate; and
(d) determining an endpoint of the etching process by detecting a change in the intensity of radiation reflected from the substrate that arises from the transition between substantial absorption of the incident radiation by the layer being etched on the substrate to at least partial reflection of the incident radiation by one or more underlayers on the substrate and transmission of the reflected radiation through a remaining portion of the layer being etched.

75. A method according to claim 74 wherein the change in the intensity of the reflected radiation represents an onset of an interference fringe.

76. A method according to claim 75 wherein the onset of the interference fringe occurs after an intensity trace of the reflected radiation that is substantially absent periodic maxima and minima.

77. A method according to claim 75 wherein the interference fringe occurs after an intensity trace comprising a substantially constant intensity level.

78. A method according to claim 74 wherein the layer comprises a thickness of less than about 50 angstroms.

79. A method according to claim 74 wherein the layer comprises a gate oxide or polysilicon layer.

80. A substrate processing apparatus comprising:
(a) a chamber comprising a support to support a substrate, a gas delivery system to introduce gas into the chamber, a plasma generator to energize the gas, and an exhaust comprising a throttle valve adapted to control the pressure of the gas in the chamber;
(b) a radiation source capable of emitting radiation having a wavelength that is substantially absorbed in a pathlength of a layer on the substrate;
(c) a radiation detector adapted to detect radiation reflected from the substrate and generate a signal; and
(d) a controller adapted to (i) control one or more of the gas delivery system, plasma generator, and throttle valve, of the chamber, and (ii) receive the signal from the radiation detector and determine an endpoint of the etching process by detecting a change in the intensity of the signal that arises from the onset of an interference fringe in the reflected radiation.

81. An apparatus according to claim 80 wherein the onset of the interference fringe occurs after an intensity trace that is substantially absent periodic maxima and minima.

82. An apparatus according to claim 80 wherein the onset of the interference fringe occurs after an intensity trace that is at a substantially constant intensity level.

83. An apparatus according to claim 80 wherein the change in intensity of the signal arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

84. An apparatus according to claim 80 wherein the layer on the substrate comprises a thickness of less than about 50 angstroms.

85. An apparatus according to claim 80 wherein the layer on the substrate comprises a gate oxide or polysilicon layer.

86. A substrate processing apparatus comprising:
(a) a chamber comprising a support to support a substrate, a gas delivery system to introduce gas into the chamber, a plasma generator to energize the gas, and an exhaust comprising a throttle valve adapted to control the pressure of the gas in the chamber;
(b) a radiation source capable of emitting radiation having a wavelength that is substantially absorbed in a pathlength of a layer on the substrate;
(c) a radiation detector adapted to detect radiation reflected from the substrate and generate a signal; and
(d) a controller adapted to (i) control one or more of the gas delivery system, plasma generator, and throttle valve, of the chamber, and (ii) receive the signal from the radiation detector and determine an endpoint of the etching process by detecting a change in the intensity of the radiation reflected from the substrate that arises from an onset of an interference fringe after an intensity trace of the reflected radiation that is substantially absent periodic maxima and minima.

87. An apparatus according to claim 86 wherein the intensity trace comprises a substantially constant intensity level.

88. An apparatus according to claim 86 wherein the change in intensity of the signal arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

89. An apparatus according to claim 86 wherein the layer on the substrate comprises a thickness of less than about 50 angstroms.

90. An apparatus according to claim 86 wherein the layer on the substrate comprises a gate oxide or polysilicon layer.

91. A substrate processing apparatus comprising:
(a) a chamber comprising a support to support a substrate, a gas delivery system to introduce gas into the chamber, a plasma generator to energize the gas, and an exhaust comprising a throttle valve adapted to control the pressure of the gas in the chamber;
(b) a radiation source capable of emitting radiation that is incident on the substrate;
(c) a radiation detector adapted to detect radiation that is reflected from the substrate and generate a signal; and
(d) a controller adapted to (i) control one or more of the gas delivery system, plasma generator, and throttle valve, of the chamber, and (ii) receive the signal from the radiation detector and determine an endpoint of the etching process by detecting a change in the intensity of the radiation reflected from the substrate that arises from an onset of an interference fringe after an intensity trace of the reflected radiation that is substantially absent periodic maxima and minima.

92. An apparatus according to claim 91 wherein the radiation source emits radiation having a wavelength that is capable of being substantially absorbed in a pathlength in the layer on the substrate.

93. An apparatus according to claim 91 wherein the intensity trace comprises a substantially constant intensity level.

94. An apparatus according to claim 91 wherein the change in intensity of the signal arises from the transition between (i) substantial absorption of the incident radiation by the layer being etched on the substrate, to (ii) at least partial reflection of the incident radiation by one or more underlayers on the substrate and transmission of the reflected radiation through the remaining portion of the layer being etched.

95. An apparatus according to claim 91 wherein the layer on the substrate comprises a thickness of less than about 50 angstroms.

96. An apparatus according to claim 91 wherein the layer on the substrate comprises a gate oxide or polysilicon layer.

* * * * *